United States Patent
Imagawa

(10) Patent No.: US 11,264,495 B2
(45) Date of Patent: Mar. 1, 2022

(54) SEMICONDUCTOR DEVICE USING REGIONS BETWEEN PADS

(71) Applicant: FUJI ELECTRIC CO., LTD., Kanagawa (JP)

(72) Inventor: Tetsutaro Imagawa, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 114 days.

(21) Appl. No.: 16/794,227

(22) Filed: Feb. 19, 2020

(65) Prior Publication Data
US 2020/0185520 A1    Jun. 11, 2020

Related U.S. Application Data

(63) Continuation of application No. PCT/JP2019/002590, filed on Jan. 25, 2019.

(30) Foreign Application Priority Data

Mar. 15, 2018   (JP) .............................. JP2018-047925

(51) Int. Cl.
*H01L 29/78*      (2006.01)
*H01L 27/07*      (2006.01)
*H01L 29/06*      (2006.01)

(52) U.S. Cl.
CPC ...... *H01L 29/7813* (2013.01); *H01L 27/0716* (2013.01); *H01L 27/0727* (2013.01); *H01L 29/0696* (2013.01); *H01L 29/7811* (2013.01)

(58) Field of Classification Search
CPC . H01L 21/28; H01L 27/0716; H01L 27/0727; H01L 29/0696; H01L 29/0834;
(Continued)

(56) References Cited

U.S. PATENT DOCUMENTS

| 10,031,164 B2 | 7/2018 | Takada |
| 2009/0032875 A1 | 2/2009 | Kawaguchi |
| (Continued) | | |

FOREIGN PATENT DOCUMENTS

| JP | 2007173411 A | 7/2007 |
| JP | 2009038318 A | 2/2009 |
| (Continued) | | |

OTHER PUBLICATIONS

International Search Report and (ISA/237) Written Opinion of the International Search Authority for International Patent Application No. PCT/JP2019/002590, mailed by the Japan Patent Office dated Mar. 19, 2019.

*Primary Examiner* — Duy T Nguyen

(57) ABSTRACT

A semiconductor device includes pads arrayed between a region where a transistor portion or a diode portion is disposed and a first end side on an upper surface of a semiconductor substrate, and a gate runner portion that transfers a gate voltage to the transistor portion. The gate runner portion has a first gate runner disposed passing between the first end side of the semiconductor substrate and at least one of the pads in the top view, and a second gate runner disposed passing between at least one of the pads and the transistor portion in the top view. The transistor portion is also disposed in the inter-pad regions, the gate trench portion disposed in the inter-pad regions is connected to the first gate runner, and the gate trench portion arranged so as to face the second gate runner is connected to the second gate runner.

18 Claims, 14 Drawing Sheets

(58) Field of Classification Search
CPC . H01L 29/407; H01L 29/417; H01L 29/4238; H01L 29/7397; H01L 29/7811; H01L 29/7813; H01L 29/8613
USPC .......................................................... 257/288
See application file for complete search history.

(56) References Cited

U.S. PATENT DOCUMENTS

| | | | |
|---|---|---|---|
| 2015/0325558 A1 | 11/2015 | Hikasa | |
| 2015/0380536 A1 | 12/2015 | Kimura | |
| 2016/0336404 A1* | 11/2016 | Naito | H01L 29/42368 |
| 2017/0162562 A1 | 6/2017 | Haruguchi | |
| 2017/0236908 A1 | 8/2017 | Naito | |
| 2017/0236926 A1* | 8/2017 | Imagawa | H01L 29/0696 |
| | | | 257/144 |
| 2018/0350961 A1 | 12/2018 | Naito | |
| 2019/0096989 A1* | 3/2019 | Yoshida | H01L 29/7397 |

FOREIGN PATENT DOCUMENTS

| | | |
|---|---|---|
| JP | 2015233133 A | 12/2015 |
| JP | 2017069412 A | 4/2017 |
| JP | 2017147435 A | 8/2017 |
| WO | 2014125583 A1 | 8/2014 |
| WO | 2016098199 A1 | 6/2016 |
| WO | 2018030440 A1 | 2/2018 |

* cited by examiner

SEMICONDUCTOR DEVICE USING REGIONS BETWEEN PADS

The contents of the following Japanese patent applications are incorporated herein by reference:
NO. 2018-047925 filed on Mar. 15, 2018, and
NO. PCT/JP2019/002590 filed on Jan. 25, 2019.

BACKGROUND

1. Technical Field

The present invention relates to a semiconductor device.

2. Related Art

Up to now, a semiconductor device has been proposed in which a transistor device such as an insulated gate bipolar transistor (IGBT) and a diode device such as a free wheel diode (FWD) are disposed on the same semiconductor substrate (for example, see patent document 1). A plurality of pads connected to the transistor device, the diode device, or the like are disposed on the semiconductor substrate. Related-art literatures include the following literatures.

Patent Document 1: Japanese Unexamined Patent Application Publication No. 2017-147435
Patent Document 2: Japanese Unexamined Patent Application Publication No. 2017-69412
Patent Document 3: Japanese Unexamined Patent Application Publication No. 2007-173411

SUMMARY

A plurality of pads are arrayed along any one of sides of a semiconductor substrate. In a semiconductor device, a region between the pads is preferably efficiently used.

To address the above-described issue, according to an aspect of the present invention, a semiconductor device including a semiconductor substrate is provided. The semiconductor device may include a transistor portion and a diode portion that are disposed on the semiconductor substrate. The semiconductor device may include a plurality of pads disposed above an upper surface of the semiconductor substrate and arrayed in an array direction between a region where the transistor portion or the diode portion is disposed and a first end side on the upper surface of the semiconductor substrate. The semiconductor device may include a gate runner portion that transfers a gate voltage to the transistor portion. The transistor portion may include a gate trench portion disposed extending in an extension direction that is different from the array direction in a top view. The gate runner portion may include a first gate runner disposed passing between the first end side of the semiconductor substrate and at least one of the pads in the top view. The gate runner portion may include a second gate runner disposed passing between at least one of the pads and the transistor portion in the top view. The transistor portion may also be disposed in at least one of inter-pad regions each sandwiched by two pads in the top view. The gate trench portion disposed in the at least one inter-pad region may be connected to the first gate runner. The gate trench portion arranged so as to face the second gate runner in the extension direction may be connected to the second gate runner.

The second gate runner may be disposed along at least two sides of at least one of the pads.

A distance between each pad and the second gate runner may be 200 μm or shorter in the top view.

The diode portion may include a first conductivity type cathode region exposed on a lower surface of the semiconductor substrate. The cathode region may not be disposed in the inter-pad region.

The transistor portion may include a first conductivity type emitter region that is exposed on the upper surface of the semiconductor substrate and in contact with the gate trench portion. The semiconductor device may include an emitter electrode disposed above the upper surface of the semiconductor substrate and connected to the emitter region. The diode portion may include dummy trench portions disposed extending in the extension direction and connected to the emitter electrode. At least one of the dummy trench portions that are arranged so as to face the inter-pad regions in the extension direction may be disposed extending up to a corresponding one of the inter-pad regions.

The transistor portion may include a first conductivity type emitter region that is exposed on the upper surface of the semiconductor substrate and in contact with the gate trench portion. The semiconductor device may include an emitter electrode disposed above the upper surface of the semiconductor substrate and connected to the emitter region. The diode portion may include a first conductivity type cathode region exposed on a lower surface of the semiconductor substrate. The diode portion may include a dummy trench portion disposed extending in the extension direction and connected to the emitter electrode. The cathode region and the dummy trench portion may be disposed in at least one of the inter-pad regions.

The transistor portion may include a first conductivity type emitter region that is exposed on the upper surface of the semiconductor substrate and in contact with the gate trench portion. At least the gate trench portion which is the closest to either of the two pads in the inter-pad region may not have the emitter region disposed in contact with the gate trench portion in the inter-pad region.

The transistor portion may include a first conductivity type emitter region that is exposed on the upper surface of the semiconductor substrate and in contact with the gate trench portion. The semiconductor device may include an emitter electrode disposed above the upper surface of the semiconductor substrate and connected to the emitter region. The semiconductor device may include an interlayer dielectric film disposed between the semiconductor substrate and the emitter electrode. A contact hole that connects the emitter electrode to the semiconductor substrate may be disposed in the interlayer dielectric film between the gate trench portion which is the closest to either of the two pads in the inter-pad region and the pad.

A dummy trench portion connected to the emitter electrode may be disposed between the gate trench portion which is the closest to either of the two pads in the inter-pad region and the pad.

Each of the plurality of pads may be disposed in such a position that the pad at least partially faces the diode portion in the extension direction.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described by way of embodiments, but the following embodiments are not intended to limit the invention described in the scope of the invention. In addition, not all combinations of features described in the embodiments necessarily have to be essential to solving means of the invention.

One side in a direction parallel to a depth direction of a semiconductor substrate is referred to as an "upper" side, and the other side is referred to as a "lower" side in the present specification. One surface out of two main surfaces of a substrate, a layer, a layer, or other components is referred to as an upper surface, and the other surface is referred to as a lower surface. The "upper" and "lower" directions are not limited to the gravitational direction or an attachment direction at the time of mounting of a semiconductor device to the substrate or the like.

According to the present specification, technical matters may be described using orthogonal coordinate axes of an X axis, a Y axis and a Z axis in some cases. According to the present specification, a plane in parallel with an upper surface of the semiconductor substrate is set as an XY plane, and the depth direction perpendicular to the upper surface of the semiconductor substrate is set as the Z axis.

According to the respective embodiments, examples are illustrated where a first conductivity type is set as an N type, and a second conductivity type is set as a P type, but the first conductivity type may also be set as the P type, and the second conductivity type may also be set as the N type. In this case, conductivity types of a substrate, a layer, a region, and the like according to the respective embodiments respectively have opposite polarities. In addition, in a case where a P+ type (or an N+ type) is described in the present specification, it means that a doping concentration is higher than the P type (or the N type), and in a case where a P− type (or an N− type) is described, it means that the doping concentration is lower than the P type (or the N type).

The doping concentration in the present specification refers to a concentration of impurities transformed to donors or acceptors. In the present specification, a difference between concentrations of donors and acceptors may be set as the doping concentration in some cases. In addition, a peak value of a doping concentration distribution in a doping region may be set as the doping concentration in the doping region in some cases.

Figure 1:
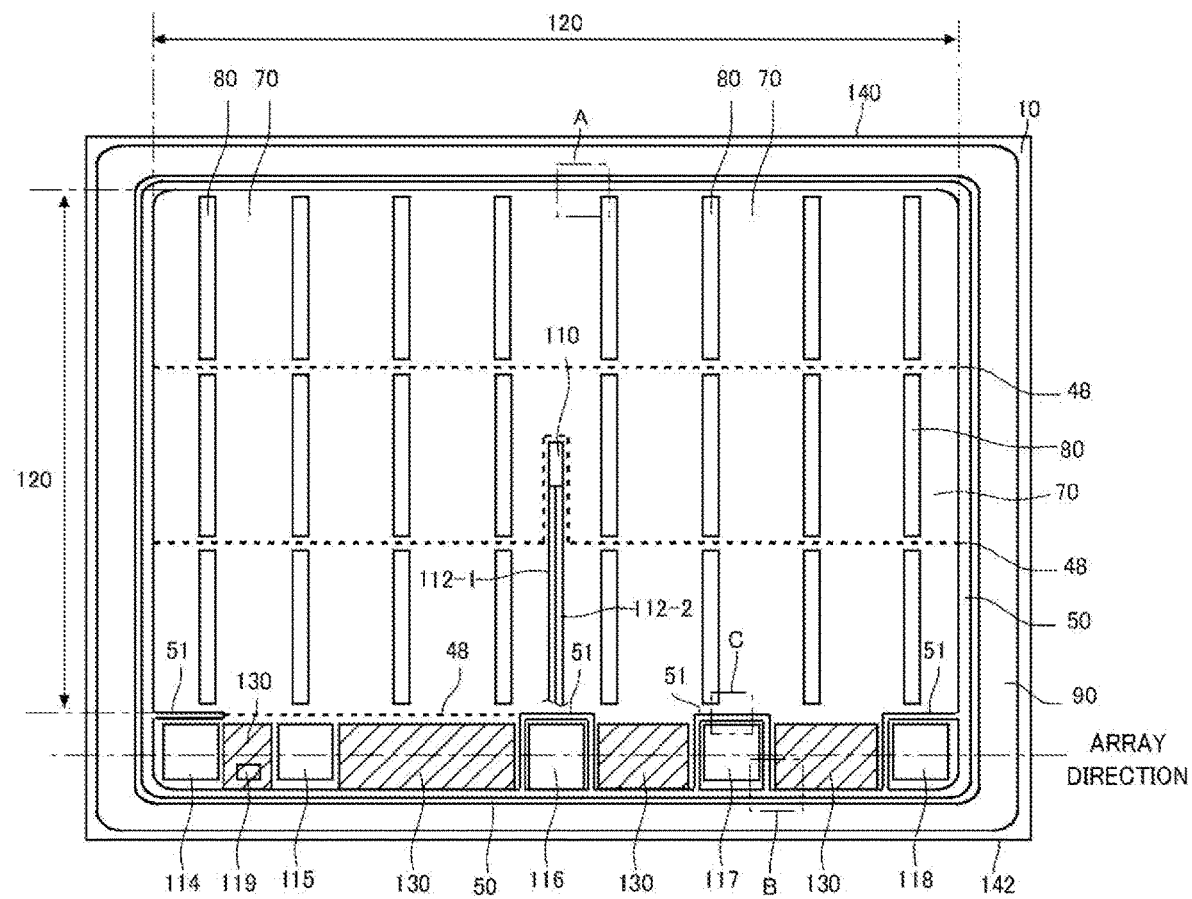
FIG. 1 is a drawing illustrating a structure of an upper surface of a semiconductor device 100 according to an embodiment of the present invention.

FIG. 1 is a drawing illustrating a structure of an upper surface of a semiconductor device 100 according to an embodiment of the present invention. The semiconductor device 100 includes a semiconductor substrate 10. The semiconductor substrate 10 may be a silicon substrate, may be a silicon carbide substrate, or may also be a nitride semiconductor substrate such as gallium nitride, or the like. The semiconductor substrate 10 in this example is a silicon substrate.

In the present specification, an end portion of an outer circumstance of the semiconductor substrate 10 in a top view is set as an outer peripheral end 140. The top view refers to a case where observation is performed from an upper surface side of the semiconductor substrate 10 in parallel with the Z axis. In addition, any one of end sides in the outer peripheral end 140 of the semiconductor substrate 10 in the top view is set as a first end side 142. A direction in parallel with the first end side 142 in the top view is set as an X axis direction, and a direction perpendicular to the first end side 142 is set as a Y axis direction.

The semiconductor device 100 includes a main active portion 120 and an edge terminal structure portion 90. The main active portion 120 corresponds to an area in an active region where a current flows in the depth direction inside the semiconductor substrate 10 from the upper surface of the semiconductor substrate 10 to the lower surface, or from the lower surface to the upper surface, excluding an inter-pad region 130 which will be described. For example, the active region is a region where a principal current flows between the upper surface and the lower surface of the semiconductor substrate 10 in a case where a transistor device included in the semiconductor device 100 is controlled to be in an on state, or a case where the transistor device is shifted from the on state to an off state. The main active portion 120 may also refer to a region excluding the pads and the inter-pad region 130 in a region surrounded by a first gate runner 50 which will be described below.

A transistor portion 70 and a diode portion 80 are disposed in the main active portion 120. In the present specification, each of the transistor portion 70 and the diode portion 80 may be referred to as a device portion or a device region in some cases. In this example, the transistor portions 70 and the diode portions 80 are alternately disposed in the main active portion 120 in the X axis direction.

A plurality of pads (in the example of FIG. 1, a sensing pad 114, an emitter pad 115, a gate pad 116, a cathode pad 117, and an anode pad 118) are disposed above the upper surface of the semiconductor substrate 10. The sensing pad 114 is connected to a current sensing device 119. The current sensing device 119 has the same structure as the transistor portion 70, and also has the smaller area in the top view (corresponding to the area of the channel) than the transistor portion 70. When a current flowing through the current sensing device 119 is detected, a current flowing through the entire semiconductor device 100 can be estimated. The emitter pad 115 is connected to an emitter electrode arranged above the upper surface of the semiconductor substrate 10.

The gate pad 116 is connected to a gate electrode of the transistor portion 70. The gate pad 116 in this example is connected to a gate runner portion which will be described below. The cathode pad 117 and the anode pad 118 are connected to a temperature sensing portion 110 which will be described below. It is noted that the number and the type of the pads disposed in the semiconductor substrate 10 are not limited to the example illustrated in FIG. 1.

Each of the pads is formed of a metallic material such as aluminum. The plurality of pads are arrayed in a predetermined array direction between the main active portion 120 and the first end side 142 on the upper surface of the semiconductor substrate 10. The plurality of pads in this example are arranged to be sandwiched by the device region and the first end side 142 in the Y axis direction.

The array direction of the plurality of pads may be a direction of a straight line that links centers of two pads (in this example, the sensing pad 114 and the anode pad 118) arranged at both ends in the direction in parallel with the first end side 142 in the top view among the plurality of pads. The array direction may be the direction in parallel with the first end side 142. The array direction may also have an inclination up to 30 degrees with respect to the first end side 142. The inclination may be up to 20 degrees, and may also be up to 10 degrees. The array direction in this example is in parallel with the first end side 142.

The region sandwiched by two pads in the top view is set as the inter-pad region 130. The inter-pad region 130 in this example is an overlapped region where two pad regions extend towards the mutual pads in a direction in parallel with the X axis. In this example, a region between the overlapped region and the first gate runner 50 disposed along the first end side 142 is also included in the inter-pad region 130.

In the semiconductor device 100, the device region is also disposed in at least one of the inter-pad regions 130. In this example, the transistor portion 70 is disposed in at least one of the inter-pad regions 130. In accordance with the above-mentioned structure, the area of the device region can be increased by effectively using the inter-pad regions 130.

The semiconductor device 100 includes the gate runner portion that transfers a gate voltage to the transistor portion 70. The semiconductor device 100 in this example includes the first gate runner 50, a second gate runner 51, and a third gate runner 48 as the gate runner portions. In this example, each of the gate runners is disposed above the upper surface of the semiconductor substrate 10 and insulated from the upper surface of the semiconductor substrate 10 by an interlayer dielectric film.

The first gate runner 50 is disposed passing between the first end side 142 of the semiconductor substrate 10 and at least one of the pads in the top view. The first gate runner 50 in this example is disposed in parallel with the first end side 142 passing between each of the sensing pad 114, the emitter pad 115, the gate pad 116, the cathode pad 117, and the anode pad 118, and the first end side 142. The first gate runner 50 is connected to the gate pad 116.

In addition, the first gate runner 50 is disposed so as to surround the main active portion 120 between the other end side of the semiconductor substrate 10 and the main active portion 120. In other words, the first gate runner 50 in this example is circularly disposed along each of the end sides of the semiconductor substrate 10. The gate runner 50 may be a metallic wiring such as aluminum, or may also be a semiconductor wiring such as polysilicon into which impurities are doped. The first gate runner 50 may have a structure in which the metallic wiring and the semiconductor wiring are disposed to be overlapped with each other with the intermediation of a dielectric film A contact hole that connects the metallic wiring to the semiconductor wiring is disposed in the dielectric film. The first gate runner 50 in this example is a metallic wiring.

A material of the second gate runner 51 and the third gate runner 48 may be a material similar to the material described with respect to the first gate runner 50. The second gate runner 51 is a metallic wiring in this example, and the third gate runner 48 is a semiconductor wiring.

The second gate runner 51 is disposed passing between at least one of the pads and the transistor portion 70 in the top view. The at least one of the pads is a pad other than the emitter pad 115. The second gate runner 51 in this example is disposed with respect to all the pads excluding the emitter pad 115. The second gate runner 51 is arranged to be sandwiched by the pad and the main active portion 120 (that is, the transistor portion 70 and the diode portion 80) in the Y axis direction. In any one of the pads, the second gate runner 51 may be arranged along two or more of sides of the pad.

For example, in a pad (in this example, the anode pad 118) arranged in one end in the X axis direction, the second gate runner 51 is arranged along two intersecting sides, and also the first gate runner 50 is arranged along the other two sides.

In addition, the current sensing device 119 is disposed in the inter-pad region 130 between a pad (in this example, the sensing pad 114) arranged in the other end in the X axis direction and the emitter pad 115. The transistor portion 70 and the diode portion 80 may not be disposed in the inter-pad region 130 where the current sensing device 119 is disposed. In one example, a P+ type well region which will be described below may be disposed in the area where the current sensing device 119 is not disposed in the inter-pad region 130.

Each pad in this example includes two pairs of parallel sides in the top view. In the example of FIG. 1, each pad includes two sides in parallel with the X axis and two sides in parallel with the Y axis. The gate runner portion may not be disposed in a side facing the current sensing device 119 among the sides of the pad. In the sensing pad 114 in this example, the second gate runner 51 is arranged along one side facing the main active portion 120. The gate runner portion is not disposed in the side facing the current sensing device 119, and the first gate runner 50 is arranged along the other two sides. The second gate runner 51 arranged along the sensing pad 114 may be connected to the second gate runner 51 disposed along the other pad via the third gate runner 48.

More specifically, the two second gate runners 51 disposed in the two pads (in this example, the sensing pad 114 and the gate pad 116) arranged to sandwich the emitter pad 115 in the X axis direction may be connected to each other via the third gate runner 48. The third gate runner 48 is arranged between the main active portion 120, and the emitter pad 115 and the inter-pad region 130 in the Y axis direction.

In addition, the second gate runner 51 is arranged along three sides that do not include the side facing the first end side 142 in the pads (in this example, the gate pad 116 and the cathode pad 117) disposed in positions excluding both ends in the X axis direction, and the first gate runner 50 is arranged along the side facing the first end side 142. The gate runner portions disposed in the surrounding of each pad are mutually connected to circularly surround the pad.

The transistor portion 70 includes a gate trench portion disposed extending in an extension direction (in this example, the Y axis direction) that is different from the array direction in the top view. A structure of the gate trench portion will be described below. The gate trench portion disposed in the inter-pad region 130 is directly or indirectly connected to the first gate runner 50 disposed along the first end side 142. In other words, the gate trench portion disposed in the inter-pad region 130 is disposed extending in the Y axis direction up to a position where the gate trench portion can be directly or indirectly connected to the first gate runner 50 arranged along the first end side 142 of the semiconductor substrate 10.

In addition, the gate trench portion of the main active portion 120 which is arranged so as to face the second gate runner 51 in the extension direction (Y axis direction) is directly or indirectly connected to the second gate runner 51. In other words, the gate trench portion arranged so as to face, in the Y axis direction, the second gate runner 51 extending in the X axis direction between the pad and the main active portion 120 is directly or indirectly connected to the second gate runner 51.

In accordance with the above-mentioned configuration, the gate trench portion of the transistor portion disposed in the main active portion 120 and the inter-pad region 130 can be connected to the gate runner portion. It is noted that when the first gate runner 50 and the second gate runner 51 are set as the metallic wirings, variation in timings for transferring the gate voltages to the respective gate trench portions and variation in attenuation amounts of the gate voltages can be reduced.

In addition, among the gate trench portions disposed in the main active portion 120, the gate trench portion disposed in a position facing the third gate runner 48 in the Y axis direction may be connected to the third gate runner 48. In addition, the gate trench portion disposed in a position facing the first gate runner 50 that is arranged along the end side opposite to the first end side 142 may be directly or indirectly connected to the first gate runner 50.

The transistor portion 70 includes a transistor such as an IGBT. The diode portion 80 and the transistor portions 70 are alternately arranged on the upper surface of the semiconductor substrate 10 in the X axis direction. An N+ type cathode region is disposed in a region in contact with the lower surface of the semiconductor substrate 10 in each of the diode portions 80. The diode portion 80 indicated by a solid line in FIG. 1 is a region where the cathode region is disposed on the lower surface of the semiconductor substrate 10. In the semiconductor device 100 in this example, regions excluding the cathode region among regions in contact with the lower surface of the semiconductor substrate are P+ type collector regions.

The diode portion 80 is a region where the cathode region is projected in a Z axis direction. The transistor portion 70 is a region where the collector region is formed on the lower surface of the semiconductor substrate 10, and a unit structure including an N+ type emitter region is periodically formed on the upper surface of the semiconductor substrate 10. A region obtained by extending the region where the cathode region is projected in the Z axis direction in the active region in the Y axis direction may also be set as the diode portion 80. A region excluding the diode portion 80 may also be set as the transistor portion 70. A boundary between the diode portion 80 and the transistor portion 70 in the X axis direction is a boundary between the cathode region and the collector region.

The transistor portion 70 may be disposed at both ends in the main active portion 120 in the Y axis direction. The main active portion 120 may be divided by the third gate runner 48 in the Y axis direction. In the respective divided regions of the main active portion 120, the transistor portions 70 and the diode portions 80 are alternately arranged in the X axis direction. In the example of FIG. 1, the main active portion 120 is divided into three by two pieces of the third gate runners 48 extending in the X axis direction. In addition, the third gate runner 48 formed of a semiconductor may also be disposed along the first gate runner 50 and the second gate runner 51 which are formed of a metal.

The edge terminal structure portion 90 is disposed between the first gate runner 50 and the outer peripheral end 140 of the semiconductor substrate 10 on the upper surface of the semiconductor substrate 10. The edge terminal structure portion 90 may be circularly arranged to surround the first gate runner 50 on the upper surface of the semiconductor substrate 10. The edge terminal structure portion 90 in this example is arranged along the outer peripheral end 140 of the semiconductor substrate 10. The edge terminal structure portion 90 mitigates electric field concentration on the upper surface side of the semiconductor substrate 10. The edge terminal structure portion 90 includes, for example, a structure of a guard ring, a field plate, a RESURF, and a combination of these.

The semiconductor device 100 in this example includes the temperature sensing portion 110 and temperature sensing wirings 112-1 and 112-2. The temperature sensing portion 110 is disposed above the main active portion 120. The temperature sensing portion 110 may be disposed in a middle of the main active portion 120 in the top view of the semiconductor substrate 10. The temperature sensing portion 110 may be disposed above the transistor portion 70 in the top view of the semiconductor substrate 10. The temperature sensing portion 110 senses a temperature of the main active portion 120. The temperature sensing portion 110 may be a pn type temperature sensing diode formed of monocrystalline or polycrystalline silicon.

The temperature sensing wiring 112 is disposed above the main active portion 120. The temperature sensing wiring 112 may be a semiconductor wiring. The temperature sensing wiring 112 is connected to the temperature sensing portion 110. The temperature sensing wiring 112 extends up to a region between the main active portion 120 and the outer peripheral end 140 on the upper surface of the semiconductor substrate 10 and is connected to the cathode pad 117 and the anode pad 118. It is noted that the semiconductor device 100 may not include the temperature sensing portion 110 and the temperature sensing wiring 112. In addition, the semiconductor device 100 may not include the current sensing device 119.

Figure 2:
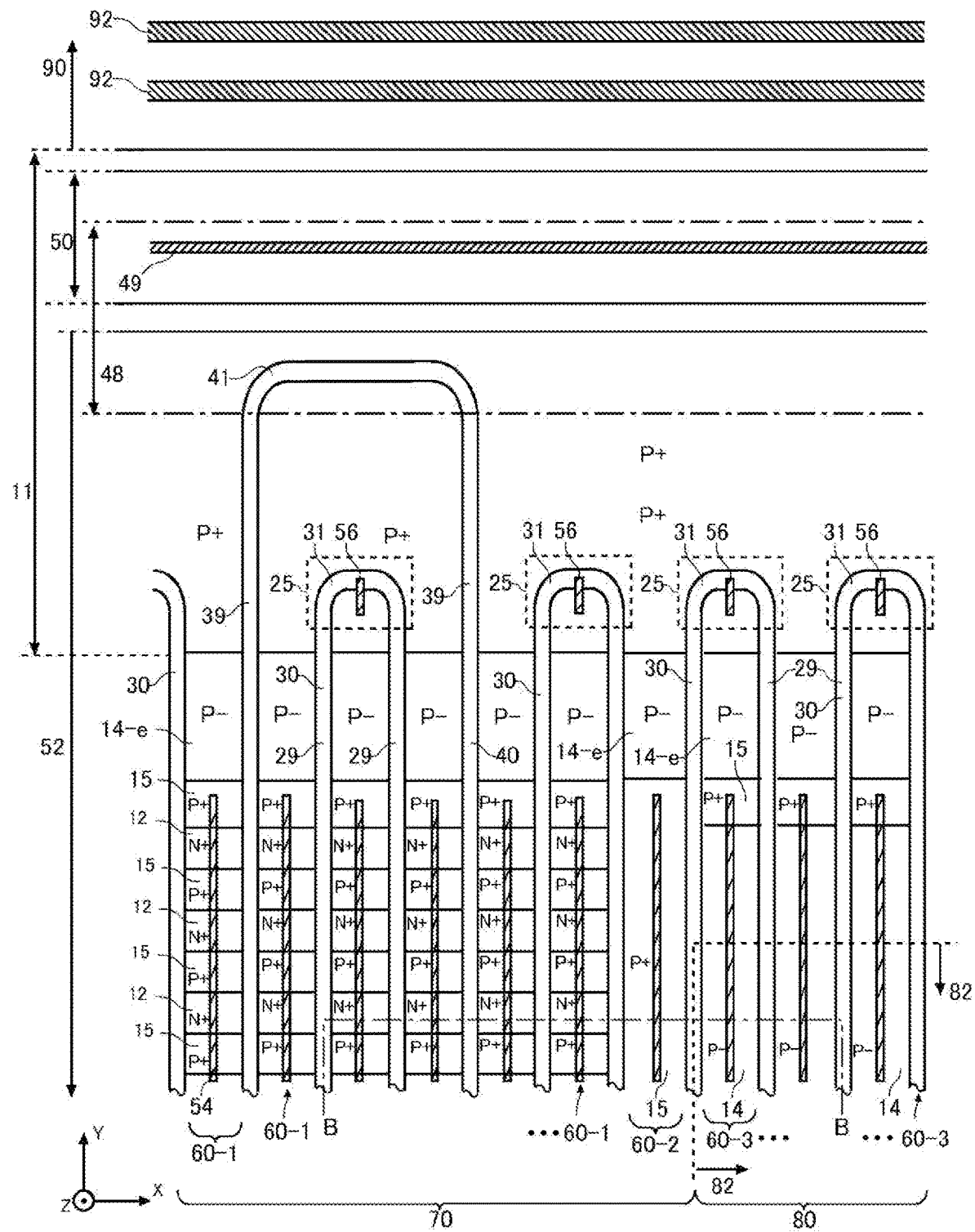
FIG. 2 is an enlarged view of an area in the vicinity of a region A in FIG. 1.

FIG. 2 is an enlarged view of an area in the vicinity of a region A in FIG. 1. The region A includes the transistor portion 70, the diode portion 80, the first gate runner 50, and the edge terminal structure portion 90. In this example, the third gate runner 48 is disposed along the first gate runner 50. The third gate runner 48 may be arranged between the first gate runner 50 and the semiconductor substrate 10. The first gate runner 50, the third gate runner 48, and the semiconductor substrate 10 are insulated from one another by the interlayer dielectric films. The semiconductor device 100 in this example includes a guard ring 92, a gate trench portion 40, a dummy trench portion 30, a P+ type well region 11, an N+ type emitter region 12, a P− type base region 14, and a P+ type contact region 15 that are disposed inside the semiconductor substrate 10 and exposed on the upper surface of the semiconductor substrate 10. In the present specification, the gate trench portion 40 or the dummy trench portion 30 may be referred to simply as a trench portion in some cases. In addition, the semiconductor device 100 in this example includes an emitter electrode 52 and the first gate runner 50 that are disposed above the upper surface of the semiconductor substrate 10. The emitter electrode 52 and the first gate runner 50 are disposed to be separated from each other.

The edge terminal structure portion 90 is arranged on an outer side of the first gate runner 50 (positive side of the Y axis direction). As described above, the edge terminal structure portion 90 may include one or more guard rings 92. The guard ring 92 is a P type region formed inside the semiconductor substrate 10. The guard ring 92 is circularly disposed so as to surround the first gate runner 50 on the outer side of the first gate runner 50.

The interlayer dielectric film is formed between the emitter electrode 52 and the first gate runner 50, and the upper surface of the semiconductor substrate 10, but this is omitted in FIG. 2. A contact hole 56, a contact hole 49, and a contact hole 54 are formed through the interlayer dielectric film in this example.

The emitter electrode 52 is in contact with the emitter region 12, the contact region 15, and the base region 14 on the upper surface of the semiconductor substrate 10 via the contact hole 54. In addition, the emitter electrode 52 is connected to a dummy conductive portion inside the dummy trench portion 30 via the contact hole 56. A connecting portion 25 formed of a material having conductivity such as polysilicon into which impurities are doped may be disposed between the emitter electrode 52 and the dummy conductive portion. A dielectric film such as an oxide film is formed between the connecting portion 25 and the upper surface of the semiconductor substrate 10.

The first gate runner 50 is connected to the third gate runner 48 via the contact hole 49 disposed in the interlayer dielectric film. The third gate runner 48 is connected to a gate conductive portion inside the gate trench portion 40. The third gate runner 48 is not connected to the dummy conductive portion inside the dummy trench portion 30. In this example, the gate trench portion 40 extends in the Y axis direction up to a position to be overlapped with the third gate runner 48, and the dummy trench portion 30 is arranged extending in the Y axis direction within a range where the dummy trench portion 30 is not overlapped with the third gate runner 48.

The third gate runner 48 arranged along the first gate runner 50 is disposed extending in the Y axis direction from a position where the third gate runner is overlapped with the first gate runner 50 up to a position where the third gate runner is not overlapped with the first gate runner 50. The third gate runner 48 is connected to the gate trench portion 40 in a position where the third gate runner is not overlapped with the first gate runner 50. It is noted that the semiconductor device 100 may not include the third gate runner 48 provided along the first gate runner 50. In this case, the gate trench portion 40 may be directly connected to the first gate runner 50.

In the present specification, a state where the gate trench portion 40 is directly connected to the first gate runner 50 (or the second gate runner 51) refers to a state where the gate trench portion 40 is arranged extending up to a position where the gate trench portion is overlapped with the first gate runner 50 (or the second gate runner 51), and the gate trench portion 40 is connected to the first gate runner 50 (or the second gate runner 51) via the contact hole. A state where the gate trench portion 40 is indirectly connected to the first gate runner 50 (or the second gate runner 51) refers to a state where the third gate runner 48 overlapped with the first gate runner 50 (or the second gate runner 51) is disposed extending in the Y axis direction up to a position where the third gate runner is not overlapped with the first gate runner 50 (or the second gate runner 51), and the gate trench portion 40 is connected to the first gate runner 50 (or the second gate runner 51) via the third gate runner 48. It is noted that in a case where the gate trench portion 40 is indirectly connected to the first gate runner 50, the gate trench portion 40 and the third gate runner 48 are connected to each other in the vicinity of the first gate runner 50. A distance in the Y axis direction between a connection point of the gate trench portion 40 and the third gate runner 48, and the first gate runner 50 may be 10 times as long as a width of the first gate runner 50 in the Y axis direction or shorter, or may also be 5 times as long as the width of the first gate runner 50 or shorter. Similarly, in a case where the gate trench portion 40 is indirectly connected to the second gate runner 51, the gate trench portion 40 and the third gate runner 48 are connected to each other in the vicinity of the second gate runner 51. A distance in the Y axis direction between the connection point of the gate trench portion 40 and the third gate runner 48, and the second gate runner 51 may be 10 times as long as a width of the second gate runner 51 in the Y axis direction or shorter, or may also be 5 times as long as the width of the second gate runner 51 or shorter. In the present specification, direct connection and indirect connection may be collectively referred to as connection in some cases.

In this example, the emitter electrode 52 and the first gate runner 50 are formed of a material including a metal. For example, at least a part of a region of each electrode is formed of aluminum or an aluminum-silicon alloy. Each electrode may include a barrier metal formed of titanium, a titanium compound, or the like placed under a region formed of aluminum or the like, and may also include a plug formed of tungsten or the like inside the contact hole.

One or more gate trench portions 40 and one or more dummy trench portions 30 are arrayed at a predetermined interval along a predetermined array direction (in this example, the X axis direction) on the upper surface of the semiconductor substrate 10. In the transistor portion 70 in this example, the one or more gate trench portions 40 and the one or more dummy trench portions 30 are alternately formed along the array direction.

The gate trench portion 40 in this example may include two linear portions 39 linearly extending along the extension direction (in this example, the Y axis direction) perpendicular to the array direction and an edge portion 41 that connects the two linear portions 39. At least a part of the edge portion 41 is preferably formed to be curved on the upper surface of the semiconductor substrate 10. In the two linear portions 39 of the gate trench portion 40, since end portions that are each an end of a linear shape along the extension direction are connected by the edge portion 41, the electric field concentration at the end portions of the linear portion 39 can be mitigated.

At least one of the dummy trench portions 30 is disposed between the respective linear portions 39 of the gate trench portion 40. These dummy trench portions 30 may include a linear portion 29 and an edge portion 31 similarly as in the gate trench portion 40. In another example, the dummy trench portion 30 may include the linear portion 29 and may not include the edge portion 31. In the example illustrated in FIG. 3, the two linear portions 29 of the dummy trench portion 30 are arranged between the two linear portions 39 of the gate trench portion 40 in the transistor portion 70.

In the diode portion 80, the plurality of dummy trench portions 30 are arranged on the upper surface of the semiconductor substrate 10 along the X axis direction. A shape of the dummy trench portion 30 in the diode portion 80 in the XY plane may be similar to that of the dummy trench portion 30 disposed in the transistor portion 70.

The edge portion 31 and the linear portion 29 of the dummy trench portion 30 have shapes similar to those of the edge portion 41 and the linear portion 39 of the gate trench portion 40. The dummy trench portion 30 disposed in the diode portion 80 and the linear shaped dummy trench portion 30 disposed in the transistor portion 70 may have the same length in the Y axis direction.

The emitter electrode 52 is formed above the gate trench portion 40, the dummy trench portion 30, the well region 11, the emitter region 12, the base region 14, and the contact region 15. The well region 11 and one of the ends of the contact hole 54 in the extension direction that is closer to where the first gate runner 50 is disposed are disposed away from each other in the XY plane. A diffusion depth of the well region 11 may be greater than both a depth of the gate trench portion 40 and a depth of the dummy trench portion 30. Parts of regions of the gate trench portion 40 and the dummy trench portion 30 in the vicinity of the first gate runner 50 are formed in the well region 11. A bottom of the edge portion 41 of the gate trench portion 40 in the Z axis direction and a bottom of the edge portion 31 of the dummy trench portion 30 in the Z axis direction may be covered with the well region 11.

One or more mesa portions 60 sandwiched by the respective trench portions are disposed in each of the transistor portion 70 and the diode portion 80. The mesa portion 60 refers to a region above the bottom of the trench portion at which the trench portion is deepest, in the region of the semiconductor substrate 10 sandwiched by the trench portions.

The base region 14 is formed in the mesa portion 60 sandwiched by the respective trench portions. The base region 14 has a second conductivity type having a doping concentration lower than that of the well region 11 (P− type).

The second conductivity type contact region 15 having a higher doping concentration than the base region 14 is formed on an upper surface of the base region 14 of the mesa portion 60. The contact region 15 in this example has the P+ type. The well region 11 on the upper surface of the semiconductor substrate 10 may be formed to be away in a direction of the first gate runner 50 from the contact region 15 arranged the farthest in the Y axis direction of the contact regions 15. The base region 14 is exposed between the well region 11 and the contact region 15 on the upper surface of the semiconductor substrate 10.

In the transistor portion 70, the first conductivity type emitter region 12 having a higher doping concentration than a drift region formed inside the semiconductor substrate 10 is selectively formed on the upper surface of the mesa portion 60-1. The emitter region 12 in this example has the N+ type. Apart that is of the base region 14 adjacent to the emitter region 12 in the depth direction (−Z axis direction) of the semiconductor substrate 10 and that is in contact with the gate trench portion 40 functions as a channel portion. When an ON-voltage is applied to the gate trench portion 40, a channel corresponding to an inversion layer for electrons is formed in a part adjacent to the gate trench portion 40 in the base region 14 disposed between the emitter region 12 and the drift region in the Z axis direction. When the channel is formed in the base region 14, carriers flow between the emitter region 12 and the drift region.

In this example, the base regions 14-e are arranged in both end portions of each of the mesa portions 60 in the Y axis direction. In this example, one of the regions adjacent to the base region 14-e that is closer to the middle part of the mesa portion 60 on the upper surface of each of the mesa portions 60 is the contact region 15. In addition, the other region adjacent to the base region 14-e opposite to the contact region 15 is the well region 11.

The contact regions 15 and the emitter regions 12 are alternately arranged along the Y axis direction in a region sandwiched by the base regions 14-e at both ends in the Y axis direction in the mesa portion 60-1 of the transistor portion 70 in this example. Each of the contact regions 15 and the emitter regions 12 is formed from one trench portion up to the other trench portion which are adjacent to each other.

The contact region 15 having a larger area than the contact region 15 of the mesa portion 60-1 is disposed in one or more mesa portions 60-2 among the mesa portions 60 of the transistor portion 70 which are disposed at the boundary with the diode portion 80. The emitter region 12 may not be disposed in the mesa portion 60-2. In the mesa portion 60-2 in this example, the contact region 15 is disposed in the entire region sandwiched by the base regions 14-e.

The contact hole 54 is formed above each of the contact regions 15 and the emitter regions 12 in each of the mesa portions 60-1 in the transistor portions 70 in this example. The contact hole 54 in the mesa portion 60-2 is formed above the contact region 15. The contact hole 54 is not formed in regions corresponding to the base region 14-e and the well region 11 in each of the mesa portions 60. The contact holes 54 in the respective mesa portions 60 in the transistor portion 70 may have the same length in the Y axis direction.

An N+ type cathode region 82 is formed in a region in contact with the lower surface of the semiconductor substrate 10 in the diode portion 80. In FIG. 2, the region where the cathode region 82 is formed is indicated by a broken line. The P+ type collector region may be formed in a region where the cathode region 82 is not formed in the region in contact with the lower surface of the semiconductor substrate 10.

The transistor portion 70 may be a region where the mesa portion 60 in which the contact region 15 and the emitter region 12 are formed and a region where the trench portion adjacent to the mesa portion 60 are disposed in a region overlapped with the collector region in the Z axis direction. It is noted however that the contact region 15 may be disposed in the mesa portion 60-2 at the boundary with the diode portion 80 instead of the emitter region 12.

The base region 14 is arranged on the upper surface of the mesa portion 60-3 of the diode portion 80. It is noted however that the contact region 15 may be disposed in a region adjacent to the base region 14-e. The contact hole 54 terminates above the contact region 15.

Figure 3:
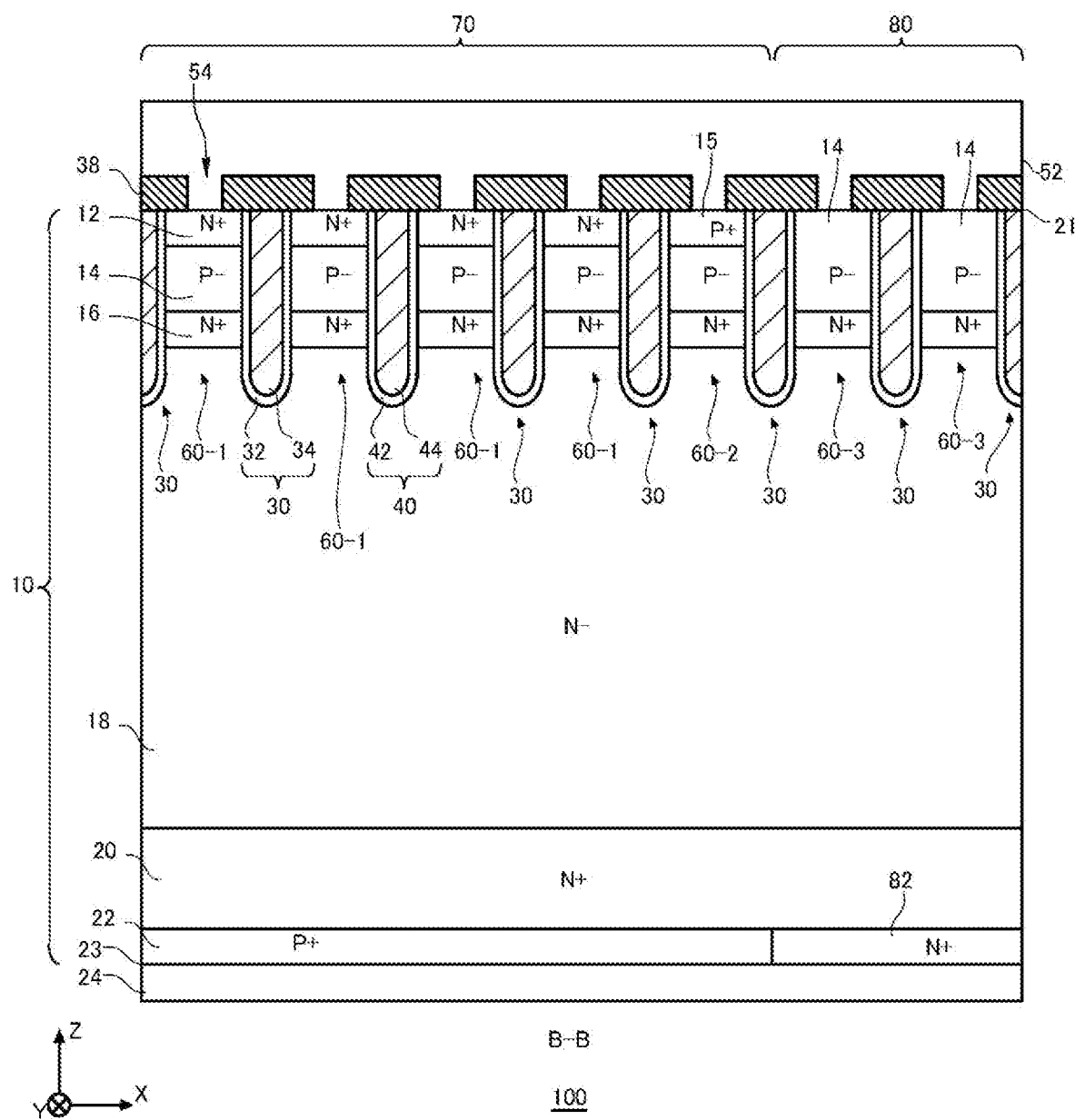
FIG. 3 is a drawing illustrating an example of a cross section taken along B-B in FIG. 2.

FIG. 3 is a drawing illustrating an example of a cross section taken along B-B in FIG. 2. The cross section taken along B-B is an XZ plane including the diode portion 80 and the transistor portion 70 and passing through the emitter region 12.

The semiconductor device 100 in this example includes the semiconductor substrate 10, an interlayer dielectric film 38, the emitter electrode 52, and a collector electrode 24 in the cross section. The interlayer dielectric film 38 is formed so as to cover at least a part of the upper surface of the semiconductor substrate 10. A through-hole such as the contact hole 54 is formed in the interlayer dielectric film 38. The upper surface of the semiconductor substrate 10 is exposed by the contact hole 54. The interlayer dielectric film 38 may be silicate glass such as PSG or BPSG, or may be an oxide film, a nitride film, or the like.

The emitter electrode 52 is formed on upper surfaces of the semiconductor substrate 10 and the interlayer dielectric film 38 in the transistor portion 70 and the diode portion 80. The emitter electrode 52 is also formed inside the contact hole 54, and is in contact with the upper surface 21 of the semiconductor substrate 10 which is exposed by the contact hole 54.

The collector electrode 24 is formed on a lower surface 23 of the semiconductor substrate 10. The collector electrode 24 may be in contact with the entire lower surface 23 of the semiconductor substrate 10. The emitter electrode 52 and the collector electrode 24 are formed of a conductive material such as a metal. In the present specification, a direction of the line connecting the emitter electrode 52 and the collector electrode 24 is referred to as a depth direction (Z axis direction). A direction from the collector electrode 24 towards the emitter electrode 52 is set as a positive Z axis direction.

The P− type base region 14 is formed on the upper surface side of the semiconductor substrate 10 in the diode portion 80 and the transistor portion 70. An N− type drift region 18 is arranged below the base region 14 inside the semiconductor substrate 10. Each of the trench portions is disposed penetrating from the upper surface of the semiconductor substrate 10 through the base region 14 to reach the drift region 18.

The N+ type emitter region 12, the P− type base region 14, and an N+ type accumulation region 16 are arranged in the stated order from the upper surface side of the semiconductor substrate 10 in each of the mesa portions 60-1 of the transistor portion 70 in the cross section. Donor is accumulated in the accumulation region 16 at a higher concentration than in the drift region 18. The drift region 18 is disposed below the accumulation region 16. The accumulation region 16 may be disposed so as to cover an entire lower surface of the base region 14 in each of the mesa portions 60. In other words, the accumulation region 16 may be sandwiched by the trench portions in the X axis direction. When the accumulation region 16 having the higher concentration than the drift region 18 is disposed between the drift region 18 and the base region 14, it is possible to reduce an ON voltage in the transistor portion 70 by increasing a carrier injection enhancement effect (IE effect, Injection-Enhancement effect).

It is noted that in an XZ cross section passing through the contact region 15 of the transistor portion 70, the contact region 15 is disposed in each of the mesa portions 60-1 of the transistor portion 70 instead of the emitter region 12. In addition, the contact region 15 is disposed in the mesa portion 60-2 instead of the emitter region 12. The contact region 15 may function as a latch-up suppressing layer that suppresses latch-up.

The P− type base region 14 and the N+ type accumulation region 16 are arranged in sequence from the upper surface side of the semiconductor substrate 10 in each of the mesa portions 60-3 of the diode portion 80 in the cross section. The drift region 18 is disposed below the accumulation region 16. The accumulation region 16 may not be disposed in the diode portion 80.

A P+ type collector region 22 is disposed in a region adjacent to the lower surface 23 of the semiconductor substrate 10 in the transistor portion 70. The N+ type cathode region 82 is disposed in the region adjacent to the lower surface 23 of the semiconductor substrate 10 in the diode portion 80.

In the semiconductor substrate 10 in this example, an N+ type buffer region 20 is disposed between the drift region 18 and the collector region 22, and between the drift region 18 and the cathode region 82. The doping concentration of the buffer region 20 is higher than the doping concentration of the drift region 18. The buffer region 20 may function as a field stop layer that avoids a state where a depleted layer spreading from the lower surface of the base region 14 reaches the P+ type collector region 22 and the N+ type cathode region 82.

One or more gate trench portions 40 and one or more dummy trench portions 30 are formed in the vicinity of the upper surface 21 of the semiconductor substrate 10. Each of the trench portions penetrates through the base region 14 from the upper surface 21 of the semiconductor substrate 10 to reach the drift region 18. In regions where at least any one of the emitter region 12, the contact region 15, and the accumulation region 16 is disposed, each of the trench portions penetrates through these regions to reach the drift region 18. A structure where the trench portions penetrate through the doping region is not limited to one fabricated by first forming the doping region, and then forming the trench portions. A structure fabricated by forming the doping region after the trench portions are formed is also included in the structure where the trench portions penetrate through the doping region.

The gate trench portion 40 includes a gate trench, a gate dielectric film 42, and a gate conductive portion 44 that are formed on the upper surface side of the semiconductor substrate 10. The gate dielectric film 42 is formed so as to cover an inner wall of the gate trench. The gate dielectric film 42 may be formed by oxidizing or nitriding the semiconductor on the inner wall of the gate trench. The gate conductive portion 44 is formed on an inner side with respect to the gate dielectric film 42 inside the gate trench. In other words, the gate dielectric film 42 insulates the gate conductive portion 44 from the semiconductor substrate 10. The gate conductive portion 44 is formed of a conductive material such as polysilicon.

The gate conductive portion 44 includes regions along the depth direction which face at least the adjacent base region 14 across the gate dielectric film 42. The gate trench portion 40 in the cross section is covered with the interlayer dielectric film 38 on the upper surface of the semiconductor substrate 10. When a predetermined voltage is applied to the gate conductive portion 44, a channel based on an inversion layer for electrons is formed on the surface layer of the boundary in contact with the gate trench in the base region 14.

The dummy trench portion 30 may have the same structure as the gate trench portion 40 in the cross section. The dummy trench portion 30 includes a dummy trench, a dummy dielectric film 32 and a dummy conductive portion 34 formed in the vicinity of the upper surface 21 of the semiconductor substrate 10. The dummy dielectric film 32 is formed to cover an inner wall of the dummy trench. The dummy conductive portion 34 is formed inside the dummy trench, and also formed on an inner side with respect to the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction. The dummy trench portion 30 in the cross section is covered with the interlayer dielectric film 38 on the upper surface 21 of the semiconductor substrate 10. It is noted that bottoms of the dummy trench portion 30 and the gate trench portion 40 may have a curved shape that is convex downward (curved shape in the cross section).

Figure 4:
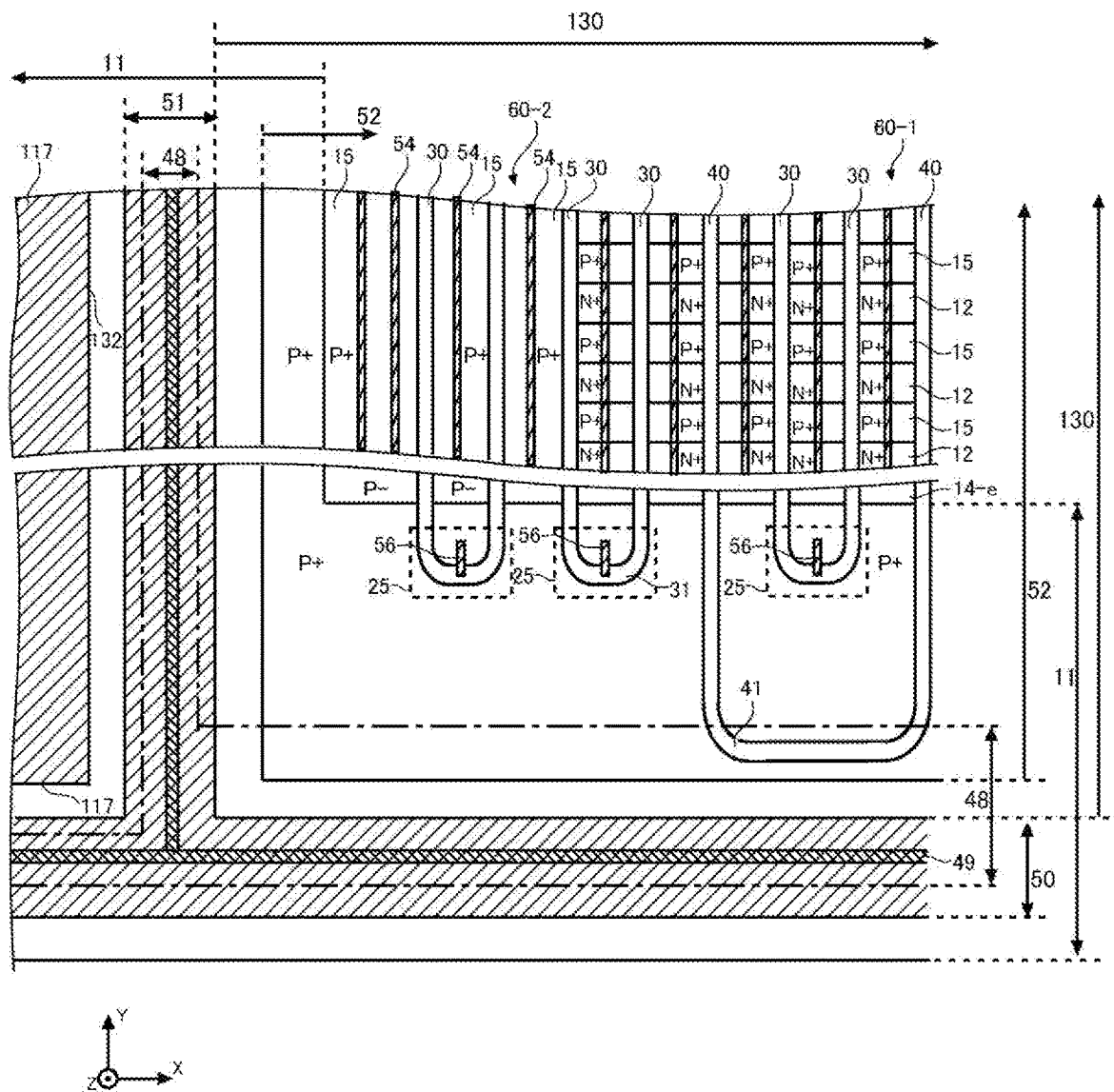
FIG. 4 is an enlarged view of an area in the vicinity of a region B in FIG. 1.

FIG. 4 is an enlarged view of an area in the vicinity of a region B in FIG. 1. The region B is a region including the pad (in this example, the cathode pad 117), the second gate runner 51 arranged along a first side 132 of the pad, the first gate runner 50, and the inter-pad region 130. The region B faces the transistor portion 70 in the main active portion 120 in the Y axis direction and does not face the diode portion 80. In addition, the first side 132 of the cathode pad 117 is a side in parallel with the Y axis direction.

The second gate runner 51 is arranged between the first side 132 of the cathode pad 117 and the inter-pad region 130. The well region 11 may be exposed on the upper surface of the semiconductor substrate 10 between the second gate runner 51 and the cathode pad 117.

As described above, the gate trench portion 40 disposed in the inter-pad region 130 is directly or indirectly connected to the first gate runner 50. The edge portion 41 of the gate trench portion 40 in this example is arranged below the third gate runner 48 and connected to the third gate runner 48.

The gate trench portion 40 disposed in the inter-pad region 130 may be a trench portion obtained by extension of the gate trench portion 40 disposed in the main active portion 120 in the Y axis direction. In other words, the gate trench portion 40 in the main active portion 120 may be continuous to the gate trench portion 40 in the inter-pad region 130.

In addition, the dummy trench portion 30 may also be disposed in the inter-pad region 130. With regard to the dummy trench portion 30 too, the dummy trench portion 30 disposed in the main active portion 120 may be disposed extending up to the inter-pad region 130. The well region 11 is disposed below the first gate runner 50. The well region 11 extends in the Y axis direction and is also disposed in a part of the inter-pad region 130. The edge portion 31 of the dummy trench portion 30 is disposed in a position to be overlapped with the well region 11. The emitter electrode 52 is also disposed from the main active portion 120 up to the position to be overlapped with the well region 11. The edge portion 31 of the dummy trench portion 30 is connected to the emitter electrode 52 via the contact hole 56. It is noted that the well region 11 is also disposed below the second gate runner 51, and the well region 11 extends in the X axis direction to be also disposed in a part of the inter-pad region 130.

The structure of each of the mesa portions 60 in the inter-pad region 130 may be the same as the structure of the mesa portion 60 in the main active portion 120 which has been described with reference to FIG. 2 and FIG. 3. The contact regions 15 and the emitter regions 12 are alternately disposed on the upper surface of the mesa portion 60-1 in the inter-pad region 130 in the Y axis direction.

In addition, in the inter-pad region 130, the dummy trench portion 30 may be disposed between the gate trench portion 40 arranged which is the closest to the cathode pad 117 in the X axis direction and the cathode pad 117. The mesa portion 60-2 in which the emitter region 12 is not disposed is arranged to be adjacent to the dummy trench portion 30. A plurality of the mesa portions 60-2 may be arranged in the X axis direction. Thus, an interval between the pad and the emitter region 12 can be increased in the inter-pad region 130.

In addition, in the inter-pad region 130, the contact hole 54 may be disposed between the gate trench portion 40 which is the closest to the cathode pad 117 in the X axis direction and the cathode pad 117. In addition, in the inter-pad region 130, the contact hole 54 may be disposed between the dummy trench portion 30 which is the closest to the cathode pad 117 in the X axis direction and the cathode pad 117. In the inter-pad region 130, the contact hole 54 may be disposed between the trench portion which is the closest to the cathode pad 117 in the X axis direction and the cathode pad 117.

In addition, the mesa portion 60 continuously disposed from the main active portion 120 up to the inter-pad region 130 in the Y axis direction may have the same structure in the main active portion 120 and the inter-pad region 130 excluding a distal end part in the Y axis direction. For example, the contact regions 15 and the emitter regions 12 may be alternately disposed in the Y axis direction on the upper surface of the mesa portion 60-1 in both the main active portion 120 and the inter-pad region 130.

In addition, the structure of the mesa portion 60 may vary in the inter-pad region 130 and the main active portion 120. For example, with regard to a part of the mesa portions 60-2, the emitter region 12 is not disposed in the inter-pad region 130, and the contact regions 15 and the emitter regions 12 may also be alternately arranged in the main active portion 120.

Figure 5:
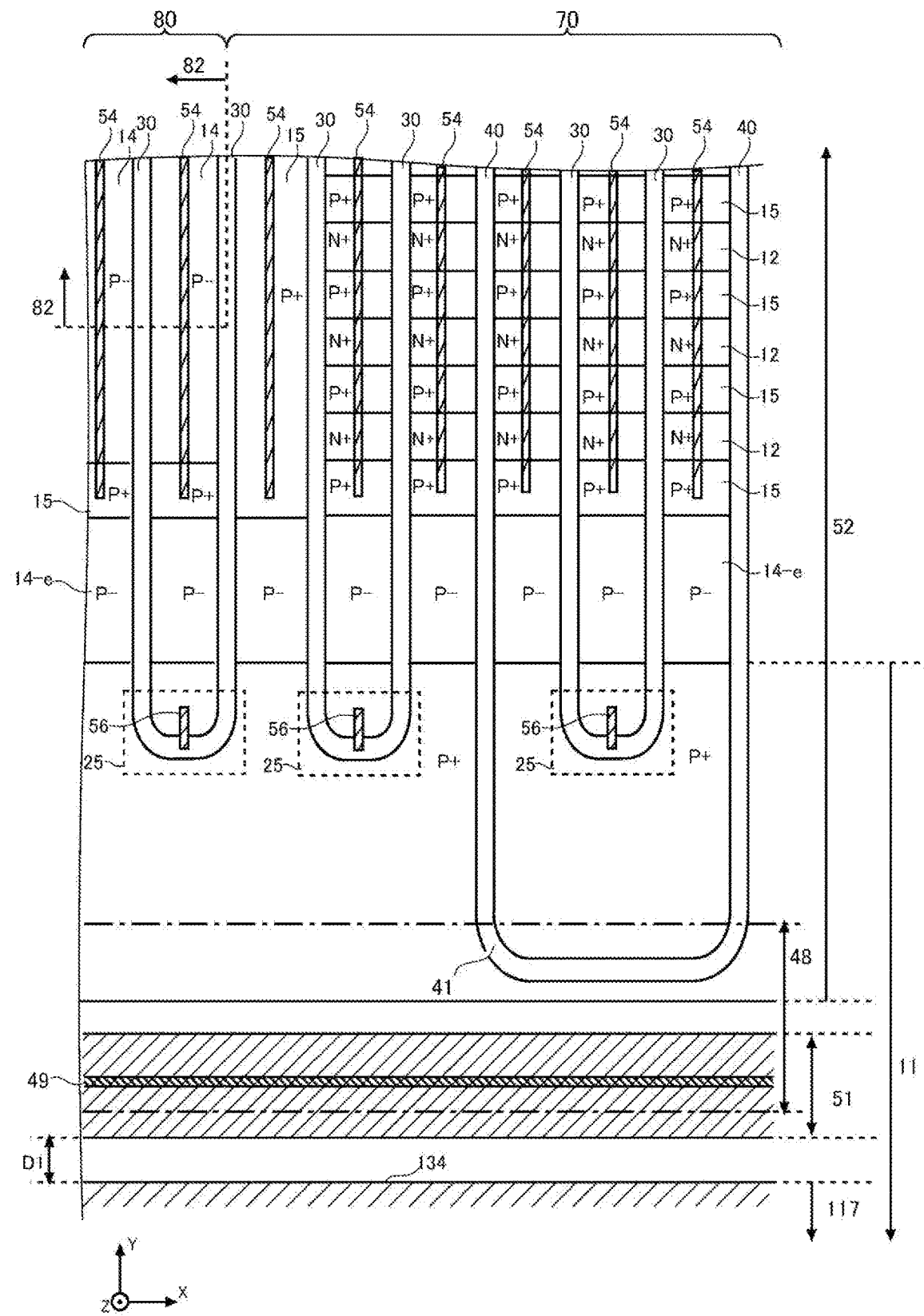
FIG. 5 is an enlarged view of an area in the vicinity of a region C in FIG. 1.

FIG. 5 is an enlarged view of an area in the vicinity of a region C in FIG. 1. The region C is a region including the pad (in this example, the cathode pad 117), the second gate runner 51 arranged along a second side 134 of the pad, and the transistor portion 70 and the diode portion 80 of the main active portion 120. In addition, the second side 134 of the cathode pad 117 is a side in parallel with the X axis direction, and is a side facing the main active portion 120.

The second gate runner 51 is arranged between the second side 134 of the cathode pad 117, and the transistor portion 70 and the diode portion 80. The well region 11 may be exposed on the upper surface of the semiconductor substrate 10 between the second gate runner 51 and the cathode pad 117.

As described above, the gate trench portion 40 arranged so as to face the second gate runner 51 in the Y axis direction is directly or indirectly connected to the second gate runner 51. The edge portion 41 of the gate trench portion 40 in this example is disposed below the third gate runner 48 and connected to the third gate runner 48.

In addition, the well region 11 is disposed below the second gate runner 51, and the well region 11 extends in the Y axis direction and is disposed up to a side of the main active portion 120 with respect to the second gate runner 51. The edge portion 31 of the dummy trench portion 30 is disposed in a position to be overlapped with the well region 11. The edge portion 31 of the dummy trench portion 30 is connected to the emitter electrode 52 via the contact hole 56.

In accordance with the structures illustrated in FIG. 4 and FIG. 5, it is facilitated that each of the gate trench portions 40 is directly or indirectly connected to the metallic first gate runner 50 and the metallic second gate runner 51. Thus, delay and attenuation variations of the gate voltages applied to the respective gate trench portions 40 can be reduced.

In addition, a distance D1 between the pad and the second gate runner 51 in the top view may be 200 μm or shorter. The distance D1 may be 150 μm or shorter, may be 120 μm or shorter, or may also be 100 μm or shorter. In addition, the distance D1 may be 1.5 times as long as a thickness of the semiconductor substrate 10 in the Z axis direction or shorter, or may also be the same length as the thickness of the semiconductor substrate 10 or shorter. The distance D1 in the Y axis direction may satisfy the above-described condition, and the distance D1 in the X axis direction may also satisfy the above-described condition. When the distance between the pad and the second gate runner 51 is decreased, the area of the active region can be increased.

Figure 6:
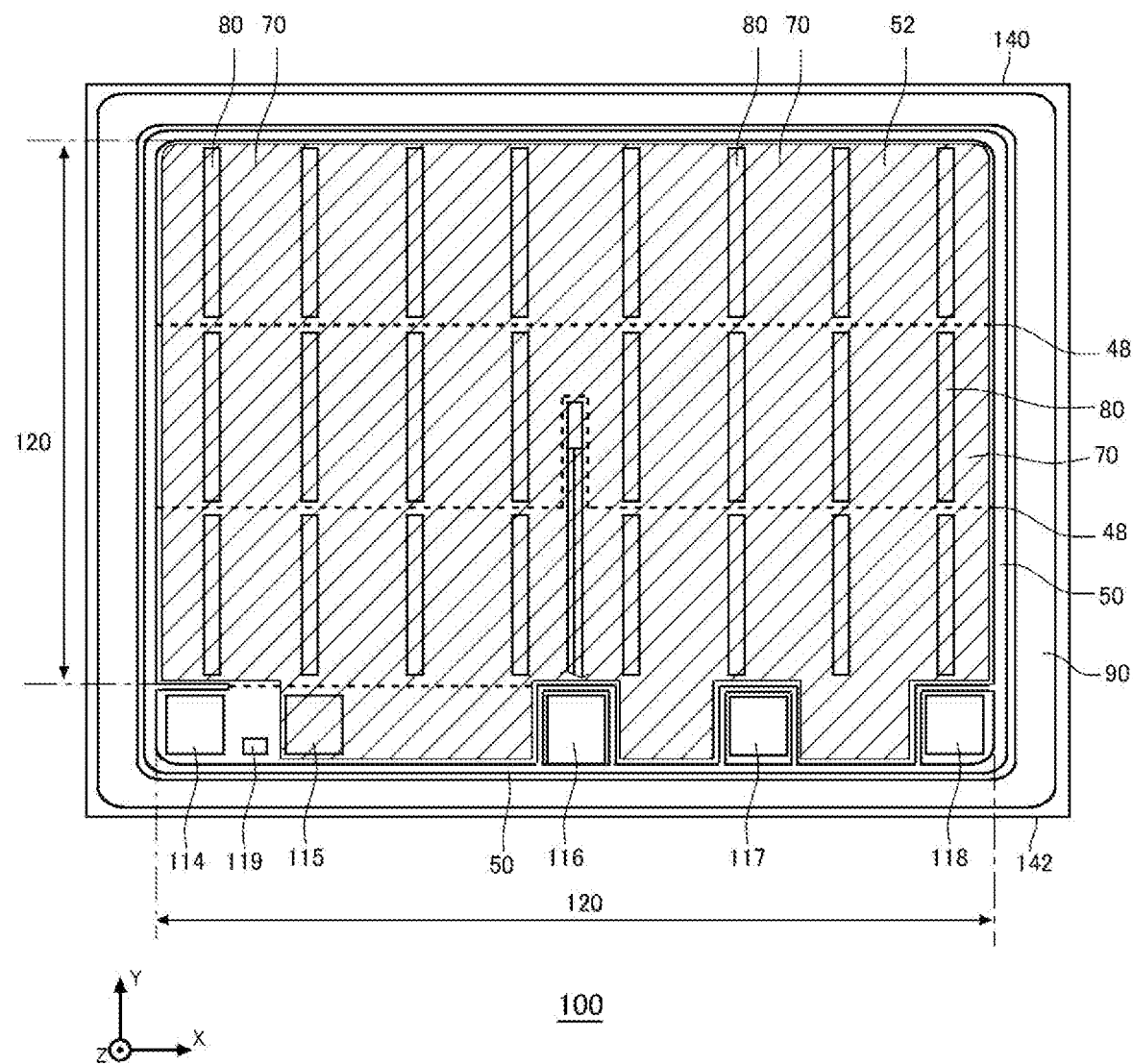
FIG. 6 is a drawing illustrating an arrangement example of an emitter electrode 52 in a top view.

FIG. 6 is a drawing illustrating an arrangement example of the emitter electrode 52 in the top view. The emitter electrode 52 may be disposed above the main active portion 120 and at least a part of the inter-pad region 130. The emitter electrode 52 in this example is not disposed above the inter-pad region 130 in which the current sensing device 119 is disposed. In addition, the emitter electrode 52 may also be disposed in a position to be overlapped with the emitter pad 115.

Figure 7:
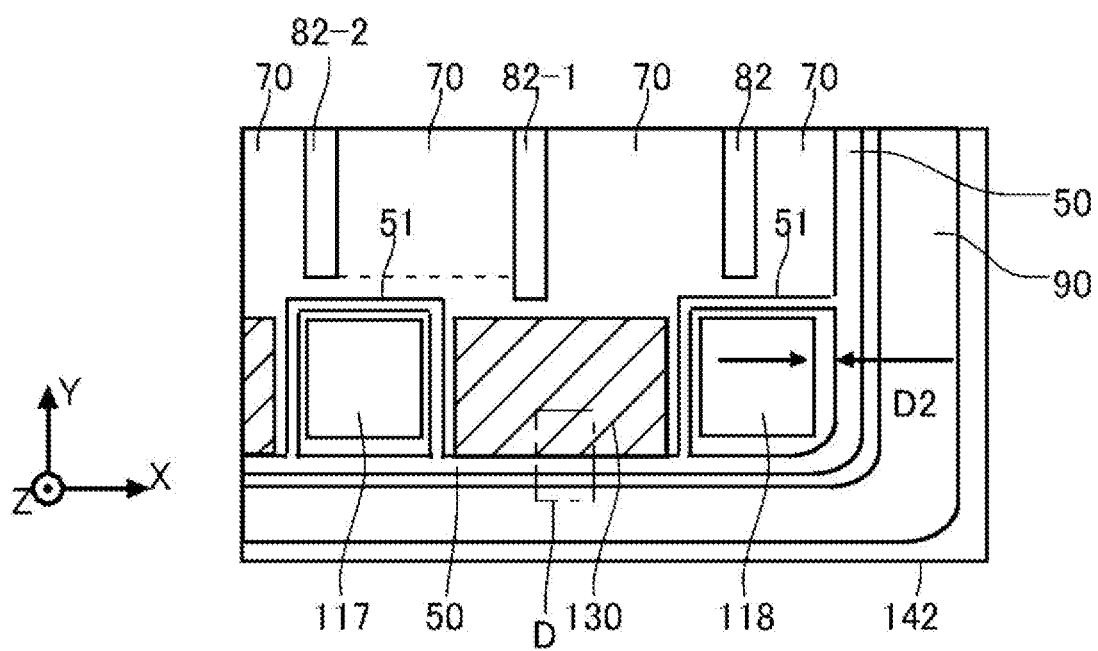
FIG. 7 is a drawing illustrating an arrangement example of a cathode region 82.

FIG. 7 is a drawing illustrating an arrangement example of the cathode region 82. The cathode region 82 is not disposed in the inter-pad region 130 in this example. In other words, the cathode region 82 disposed in the main active portion 120 does not extend up to the inter-pad region 130 to be disposed there. It is noted however that the structure of the diode portion 80 excluding the cathode region 82 may be disposed in the inter-pad region 130. In accordance with the above-mentioned structure, a distance between the N+ type cathode region 82 and the P+ type well region 11 that is relatively deeply formed can be secured, and withstand pressure reduction caused since the device region is disposed in the inter-pad region 130 can be suppressed.

It is noted that the cathode region 82-1 arranged so as to face the inter-pad region 130 in the Y axis direction may be disposed to be longer in the Y axis direction than the cathode region 82-2 arranged so as to face the pad or the second gate runner 51 in the Y axis direction. It is noted however that the cathode region 82-1 does not extend up to the inter-pad region 130. Thus, while the area of the cathode region 82 is increased, it is facilitated to secure the distance between the cathode region 82 and the well region 11.

It is noted that each of the plurality of pads arranged along the first end side 142 may be disposed in such a position that the pad at least partially faces the diode portion 80 (cathode region 82) in the Y axis direction. Thus, it is facilitated that the structure of the transistor portion 70 disposed in the main active portion 120 is disposed extending up to the inter-pad region 130. For this reason, the area of the transistor portion 70 can be easily increased.

In addition, a distance D2 between the pad arranged at the farthest end in the X axis direction and the first gate runner 50 in the X axis direction may be 500 µm or shorter. When the pad is arranged to be close to the first gate runner 50, the inter-pad region 130 can be enlarged in the X axis direction. The distance D2 may be 300 µm or shorter, may be 200 µm or shorter, or may also be 100 µm or shorter. The distance D2 may be 1.5 times as long as the thickness of the semiconductor substrate 10 or shorter, or may also be the same length as the thickness of the semiconductor substrate 10 or shorter.

Figure 8:
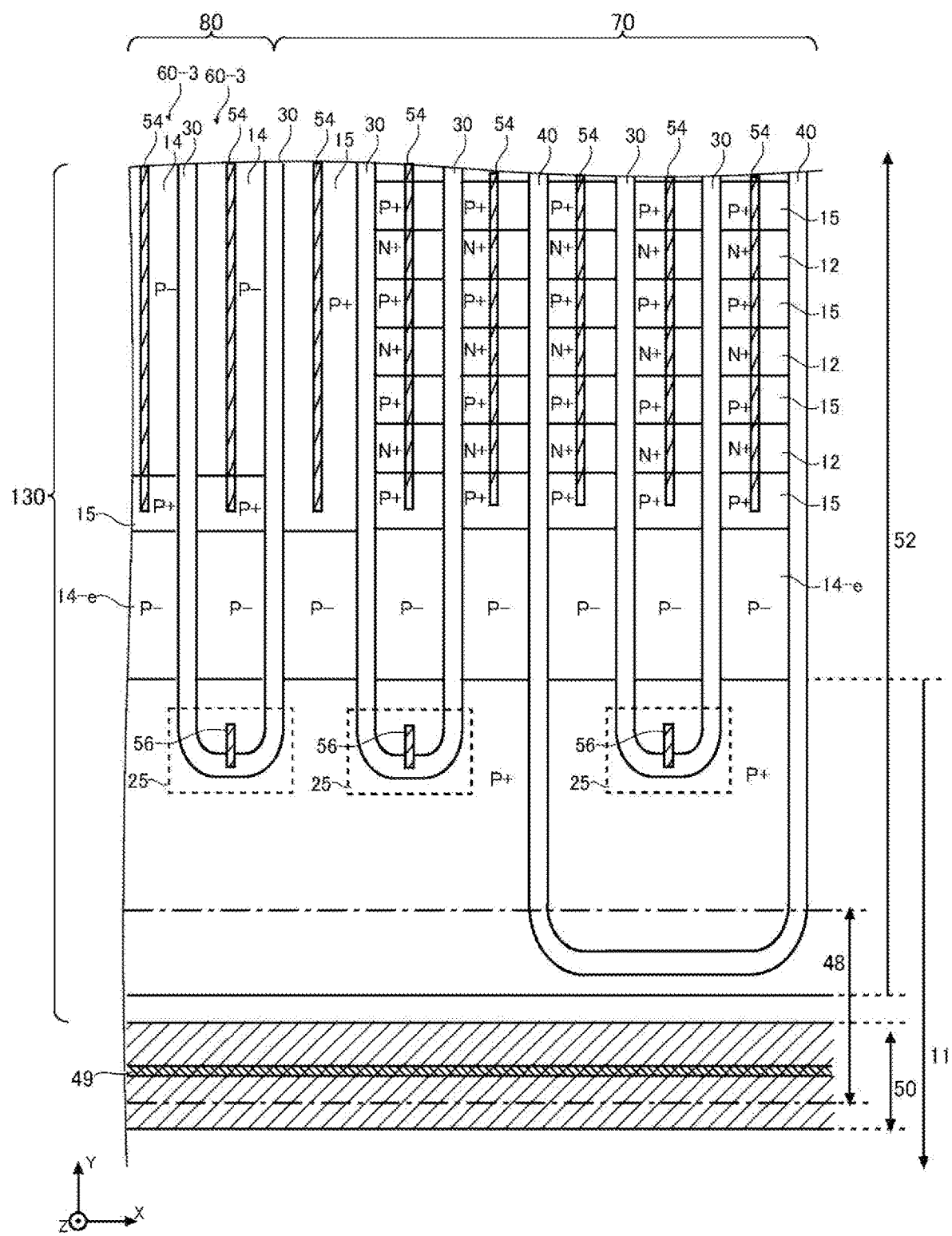
FIG. 8 is an enlarged view of an area in the vicinity of a region D in FIG. 7.

FIG. 8 is an enlarged view of an area in the vicinity of a region D in FIG. 7. The region D is a region facing the diode portion 80 and the transistor portion 70 of the main active portion 120 in the Y axis direction in the inter-pad region 130.

As described with reference to FIG. 7, the cathode region 82 is not disposed in the inter-pad region 130. It is noted however that the dummy trench portion 30 of the diode portion 80 arranged so as to face the inter-pad region 130 in the Y axis direction is disposed extending up to the inter-pad region 130. In addition, the mesa portion 60-3 of the diode portion 80 is also disposed extending up to the inter-pad region 130.

In accordance with the above-mentioned structure, while structural continuity is maintained between the inter-pad region 130 and the main active portion 120, the distance between the cathode region 82 and the well region 11 can be secured. When the structural continuity is maintained, it is possible to suppress local concentration of the electric field.

Figure 9:
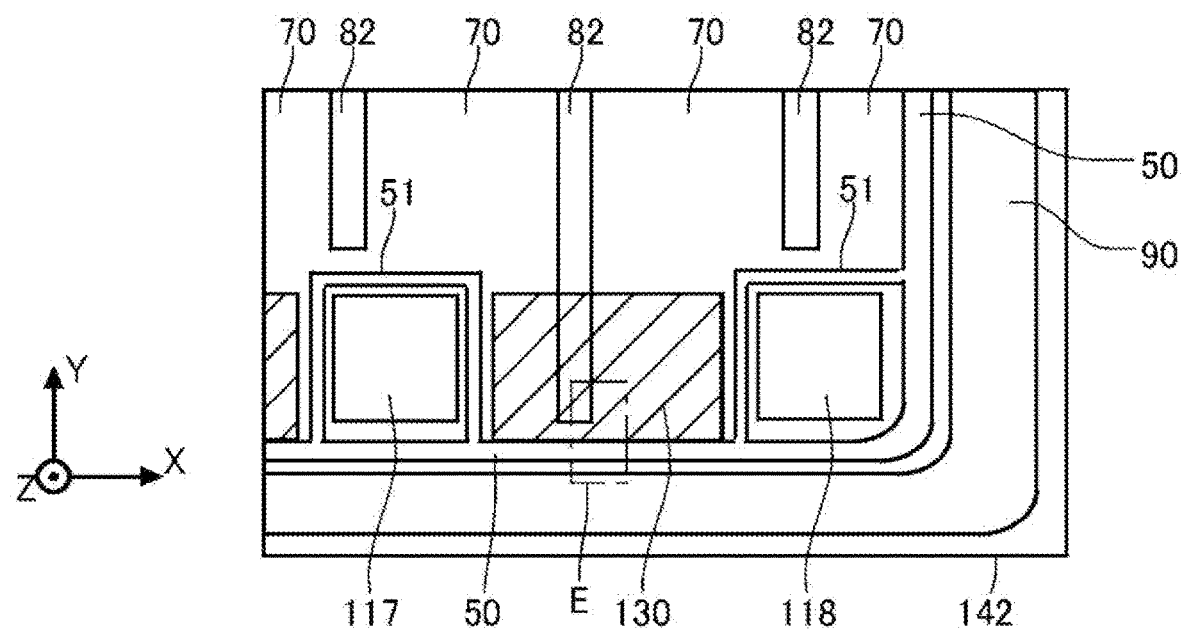
FIG. 9 is a drawing illustrating another arrangement example of the cathode region 82.

FIG. 9 is a drawing illustrating another arrangement example of the cathode region 82. The cathode region 82 is disposed in the inter-pad region 130 in this example. For example, the cathode region 82 disposed in the main active portion 120 is disposed extending up to the inter-pad region 130. In accordance with the above-mentioned structure, the area of the cathode region 82 is increased, and the device region operating as the diode portion 80 can be enlarged.

It is noted that in a case where a distance between the cathode region 82 and the well region 11 in the X axis direction becomes too close, it is preferable that the cathode region 82 of the main active portion 120 does not extend up to the inter-pad region 130. In one example, under a condition that the distance between the cathode region 82 and the well region 11 in the X axis direction becomes 200 µm or longer, the cathode region 82 may extend up to the inter-pad region 130. The distance may be 100 µm or longer, and may also be longer than the thickness of the semiconductor substrate 10.

Figure 10:
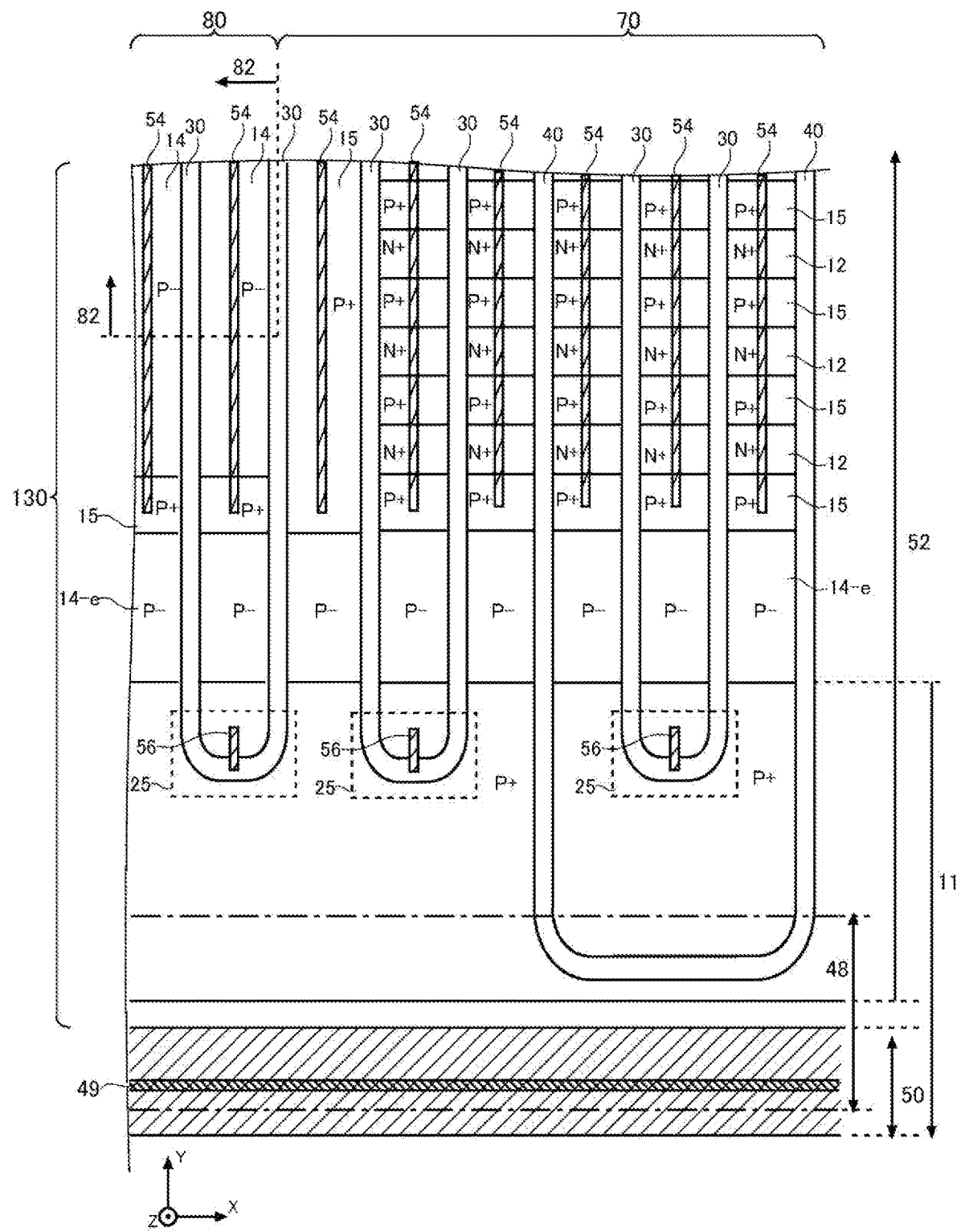
FIG. 10 is an enlarged view of an area in the vicinity of a region E in FIG. 9.

FIG. 10 is an enlarged view of an area in the vicinity of a region E in FIG. 9. The region E is a region facing the diode portion 80 and the transistor portion 70 of the main active portion 120 in the Y axis direction in the inter-pad region 130.

As described with reference to FIG. 9, the cathode region 82 is disposed in the inter-pad region 130. In addition, the dummy trench portion 30 and the mesa portion 60-3 are also disposed extending up to the inter-pad region 130. In accordance with the above-mentioned structure, the area of the diode portion 80 can be increased.

Figure 11:
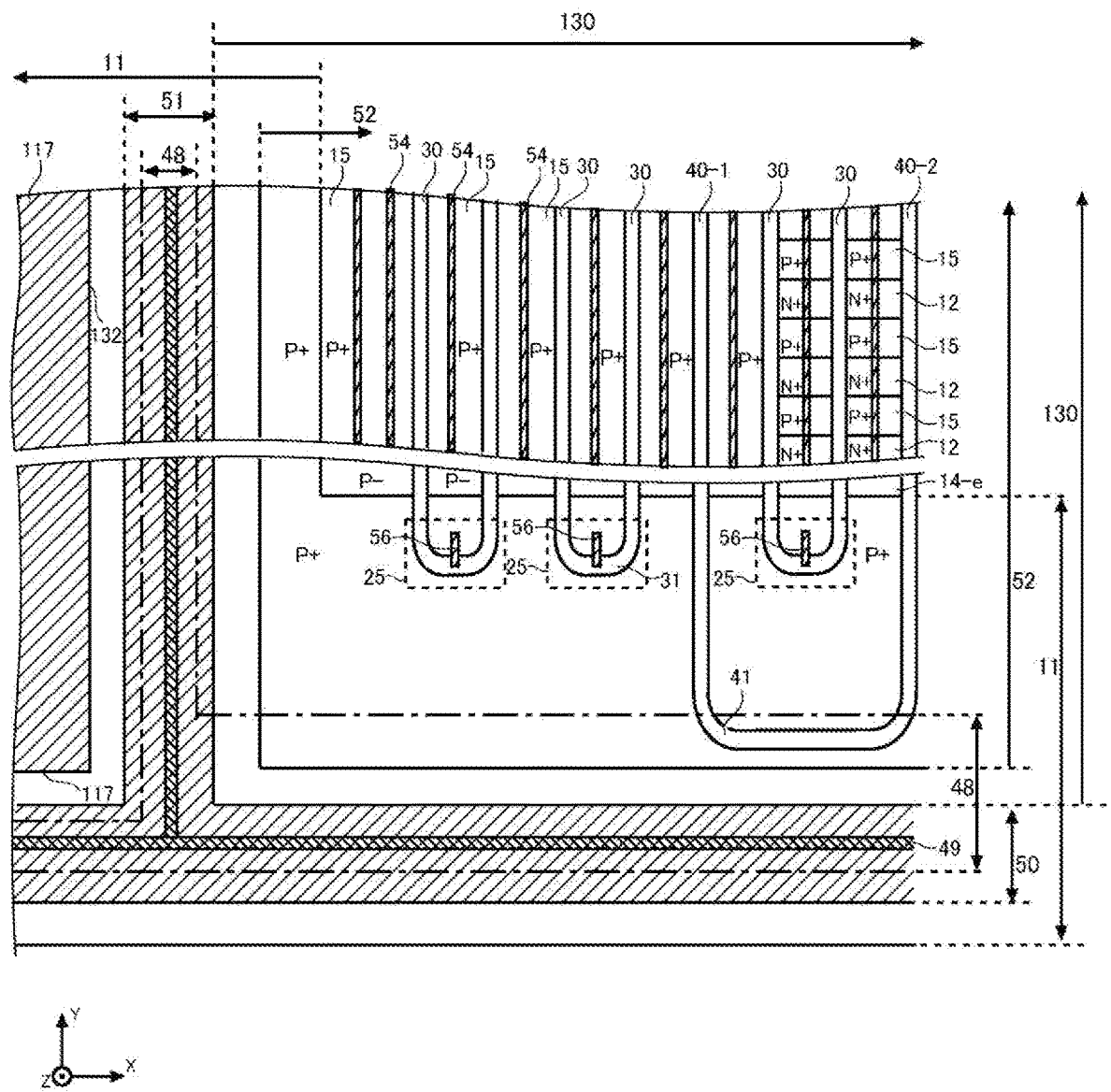
FIG. 11 illustrates another example of the region B in FIG. 1.

FIG. 11 illustrates another example of the region B in FIG. 1. In this example, the emitter region 12 is not disposed in contact with the gate trench portion 40-1 which is the closest to the pad in the X axis direction among the gate trench portions 40 disposed in the inter-pad region 130. Thus, the distance between the pad and the emitter region 12 can be further increased. The contact region 15 may be disposed in the mesa portion 60 adjacent to the gate trench portion 40-1 instead of the emitter region 12.

Figure 12:
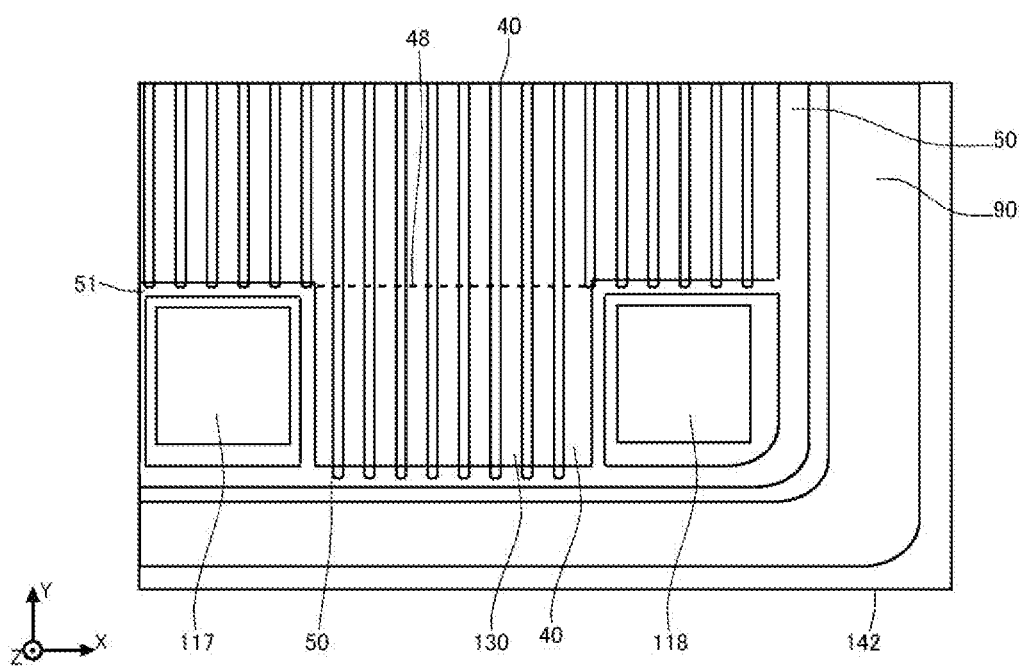
FIG. 12 is a drawing illustrating an arrangement example of gate trench portions 40 in a main active portion 120 and an inter-pad region 130.

FIG. 12 is a drawing illustrating an arrangement example of the gate trench portions 40 in the main active portion 120 and the inter-pad region 130. As described above, the gate trench portion 40 in the inter-pad region 130 and the gate trench portion 40 in the main active portion 120 may be continuously disposed. Similarly, the dummy trench portions 30 may also be continuously disposed in the inter-pad region 130 and the main active portion 120.

Figure 13:
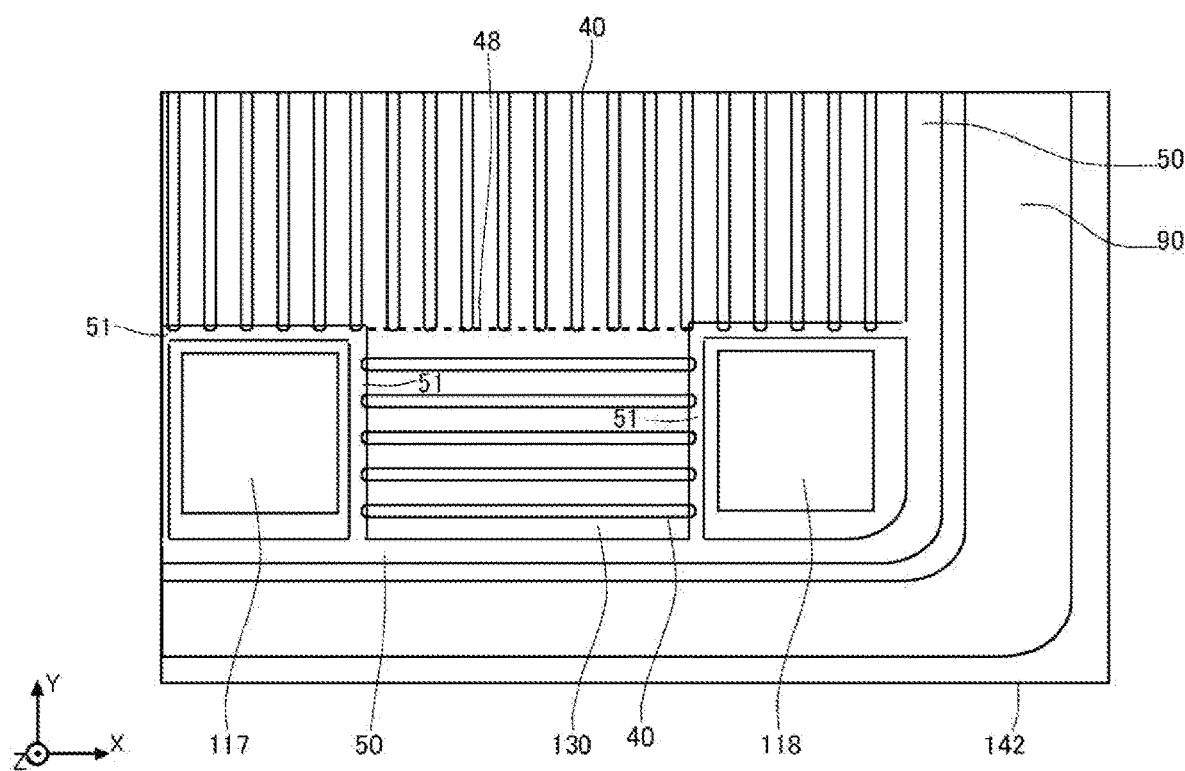
FIG. 13 is a drawing illustrating another arrangement example of the gate trench portions 40 in the main active portion 120 and the inter-pad region 130.

FIG. 13 is a drawing illustrating another arrangement example of the gate trench portions 40 in the main active portion 120 and the inter-pad region 130. In this example, the gate trench portion 40 in the inter-pad region 130 is separated from the gate trench portion 40 of the main active portion 120. The gate trench portion 40 in the inter-pad region 130 may be disposed extending in the X axis direction. The gate trench portion 40 in the inter-pad region 130 may be directly or indirectly connected to the second gate runner 51 disposed in the Y axis direction. The gate trench portion 40 in this example is directly or indirectly connected to the second gate runner 51 disposed at both ends of the inter-pad region 130 in the X axis direction. The dummy trench portion 30 in the inter-pad region 130 may also be disposed extending in a direction in parallel with the gate trench portion 40.

It is noted that the gate trench portion 40 of the main active portion 120 which faces the inter-pad region 130 in the Y axis direction may be connected to the third gate runner 48 arranged between the inter-pad region 130 and the main active portion 120. The third gate runner 48 is connected to the second gate runners 51 disposed at both ends of the inter-pad region 130 in the X axis direction. In accordance with the above-mentioned structure too, each of the gate trench portions 40 can be connected to the gate runner portion.

Figure 14:
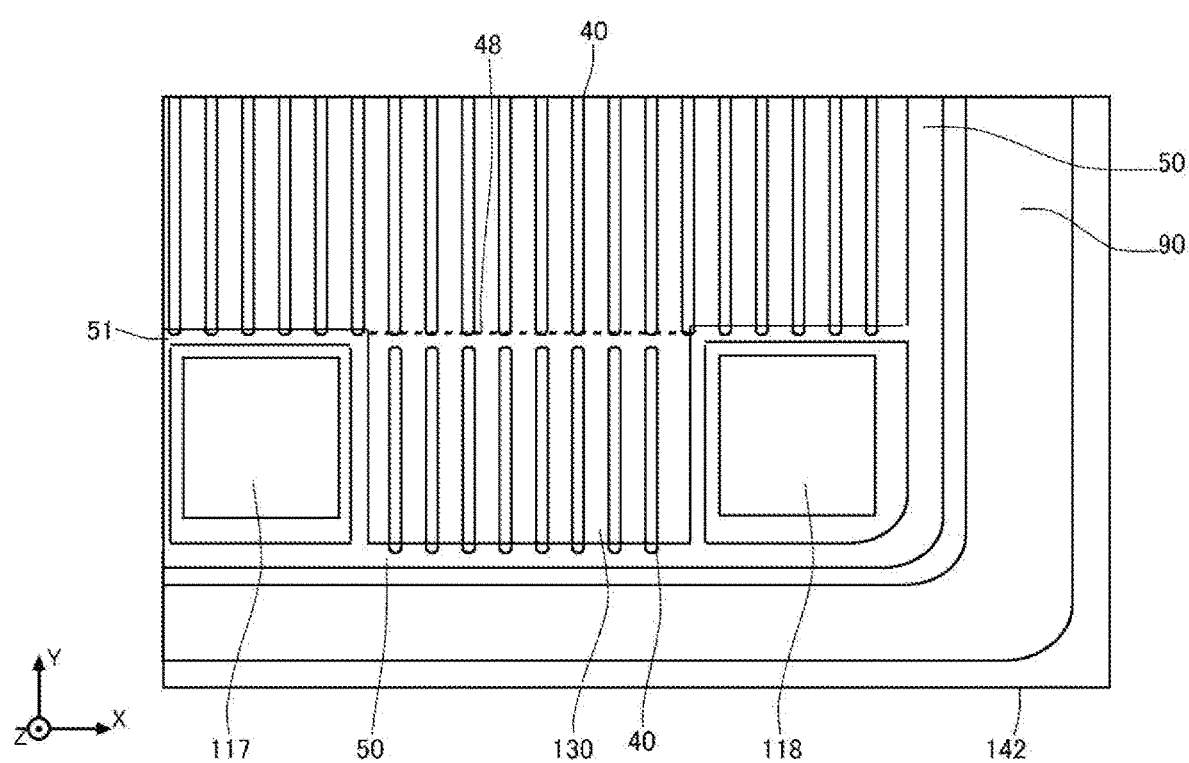
FIG. 14 is a drawing illustrating another arrangement example of the gate trench portions 40 in the main active portion 120 and the inter-pad region 130.

FIG. 14 is a drawing illustrating another arrangement example of the gate trench portions 40 in the main active portion 120 and the inter-pad region 130. In this example, the gate trench portion 40 in the inter-pad region 130 is separated from the gate trench portion 40 of the main active portion 120. In this example, the gate trench portion 40 in the inter-pad region 130 is disposed extending in the Y axis direction.

The gate trench portion 40 in the inter-pad region 130 may be connected to the first gate runner 50. The gate trench portion 40 of the main active portion 120 which faces the inter-pad region 130 in the Y axis direction may be connected to the third gate runner 48 arranged between the inter-pad region 130 and the main active portion 120. In accordance with the above-mentioned structure too, each of the gate trench portions 40 can be connected to the gate runner portion.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . semiconductor substrate, 11 . . . well region, 12 . . . emitter region, 14 . . . base region, 15 . . . contact region, 16 . . . accumulation region, 18 . . . drift region, 20 . . . buffer region, 21 . . . upper surface, 22 . . . collector region, 23 . . . lower surface, 24 . . . collector electrode, 25 . . . connecting portion, 29 . . . linear portion, 30 . . . dummy trench portion, 31 . . . edge portion, 32 . . . dummy dielectric film, 34 . . . dummy conductive portion, 38 . . . interlayer dielectric film, 39 . . . linear portion, 40 . . . gate trench portion, 41 . . . edge portion, 42 . . . gate dielectric film, 44 . . . gate conductive portion, 48 . . . third gate runner, 49 . . . contact hole, 50 . . . first gate runner, 51 . . . second gate runner, 52 . . . emitter electrode, 54 . . . contact hole, 56 . . . contact hole, 60 . . . mesa portion, 70 . . . transistor portion, 80 . . . diode portion, 82 . . . cathode region, 90 . . . edge terminal structure portion, 92 . . . guard ring, 100 . . . semiconductor device, 110 . . . temperature sensing portion, 112 . . . temperature sensing wiring, 114 . . . sensing pad, 115 . . . emitter pad, 116 . . . gate pad, 117 . . . cathode pad, 118 . . . anode pad, 119 . . . current sensing device, 120 . . . main active portion, 130 . . . inter-pad region, 132 . . . first side, 134 . . . second side, 140 . . . outer peripheral end, 142 . . . first end side

What is claimed is:

1. A semiconductor device comprising a semiconductor substrate, wherein
the semiconductor device comprises:
  a transistor portion and a diode portion that are disposed on the semiconductor substrate;
  a plurality of pads disposed above an upper surface of the semiconductor substrate and arrayed in an array direction between a region where the transistor portion or the diode portion is disposed and a first end side on the upper surface of the semiconductor substrate; and
  a gate runner portion that transfers a gate voltage to the transistor portion,
the transistor portion includes a gate trench portion disposed extending in an extension direction that is different from the array direction in a top view,
the gate runner portion includes:
  a first gate runner disposed passing between the first end side of the semiconductor substrate and at least one of the pads in the top view; and
  a second gate runner disposed passing between each of at least two pads of the plurality of pads and the transistor portion in the top view,
the transistor portion is also disposed in at least one of inter-pad regions each sandwiched by two pads in the top view,
the gate trench portion disposed in the at least one inter-pad region is connected to the first gate runner, and
the gate trench portion arranged so as to face the second gate runner in the extension direction is connected to the second gate runner.

2. The semiconductor device according to claim 1, wherein
the second gate runner is disposed along at least two sides of at least one of the pads.

3. The semiconductor device according to claim 1, wherein
a distance between each pad and the second gate runner is 200 μm or shorter in the top view.

4. The semiconductor device according to claim 1, wherein:
the transistor portion includes a first conductivity type emitter region that is exposed on the upper surface of the semiconductor substrate and in contact with the gate trench portion;
the semiconductor device comprises an emitter electrode disposed above the upper surface of the semiconductor substrate and connected to the emitter region;
the diode portion includes:
  a first conductivity type cathode region exposed on a lower surface of the semiconductor substrate; and
  a dummy trench portion disposed extending in the extension direction and connected to the emitter electrode, and
the cathode region and the dummy trench portion are disposed in at least one of the inter-pad regions.

5. The semiconductor device according to claim 1, wherein:
the transistor portion includes a first conductivity type emitter region that is exposed on the upper surface of the semiconductor substrate and in contact with the gate trench portion; and
at least the gate trench portion which is the closest to either of the two pads in the inter-pad region does not have the emitter region disposed in contact with the gate trench portion in the inter-pad region.

6. The semiconductor device according to claim 1, wherein
the transistor portion includes a first conductivity type emitter region that is exposed on the upper surface of the semiconductor substrate and in contact with the gate trench portion,
the semiconductor device comprises:
an emitter electrode disposed above the upper surface of the semiconductor substrate and connected to the emitter region; and
an interlayer dielectric film disposed between the semiconductor substrate and the emitter electrode, and
a contact hole that connects the emitter electrode to the semiconductor substrate is disposed in the interlayer dielectric film between the gate trench portion which is the closest to either of the two pads in the inter-pad region and the pad.

7. The semiconductor device according to claim 6, wherein
a dummy trench portion connected to the emitter electrode is disposed between the gate trench portion which is the closest to either of the two pads in the inter-pad region and the pad.

8. The semiconductor device according to claim 1, wherein
each of the plurality of pads is disposed in such a position that the pad at least partially faces the diode portion in the extension direction.

9. The semiconductor device according to claim 1, wherein
the transistor portion further includes an other gate trench portion disposed extending in the extension direction and adjacent to the gate trench portion,
a base region is provided between the gate trench portion and the other gate trench portion, and
a well region is provided in the at least one of inter-pad regions, the well region being provided at a deeper position in the semiconductor substrate and having higher doping concentration than the base region.

10. A semiconductor device comprising a semiconductor substrate, wherein:
the semiconductor device comprises:
a transistor portion and a diode portion that are disposed on the semiconductor substrate;
a plurality of pads disposed above an upper surface of the semiconductor substrate and arrayed in an array direction between a region where the transistor portion or the diode portion is disposed and a first end side on the upper surface of the semiconductor substrate; and
a gate runner portion that transfers a gate voltage to the transistor portion,
the transistor portion includes a gate trench portion disposed extending in an extension direction that is different from the array direction in a top view,
the gate runner portion includes:
a first gate runner disposed passing between the first end side of the semiconductor substrate and at least one of the pads in the top view; and
a second gate runner disposed passing between at least one of the pads and the transistor portion in the top view,
the transistor portion is also disposed in at least one of inter-pad regions each sandwiched by two pads in the top view,
the gate trench portion disposed in the at least one inter-pad region is connected to the first gate runner,
the gate trench portion arranged so as to face the second gate runner in the extension direction is connected to the second gate runner,
the diode portion includes a first conductivity type cathode region exposed on a lower surface of the semiconductor substrate; and
the cathode region is not disposed in the inter-pad regions.

11. The semiconductor device according to claim 10, wherein:
the transistor portion includes a first conductivity type emitter region that is exposed on the upper surface of the semiconductor substrate and in contact with the gate trench portion;
the semiconductor device comprises an emitter electrode disposed above the upper surface of the semiconductor substrate and connected to the emitter region;
the diode portion includes dummy trench portions disposed extending in the extension direction and connected to the emitter electrode; and
at least one of the dummy trench portions that are arranged so as to face the inter-pad regions in the extension direction is disposed extending up to a corresponding one of the inter-pad regions.

12. The semiconductor device according to claim 10, wherein
the second gate runner is disposed along at least two sides of at least one of the pads.

13. The semiconductor device according to claim 10, wherein
a distance between each pad and the second gate runner is 200 μm or shorter in the top view.

14. The semiconductor device according to claim 10, wherein:
the transistor portion includes a first conductivity type emitter region that is exposed on the upper surface of the semiconductor substrate and in contact with the gate trench portion; and
at least the gate trench portion which is the closest to either of the two pads in the inter-pad region does not have the emitter region disposed in contact with the gate trench portion in the inter-pad region.

15. The semiconductor device according to claim 10, wherein
the transistor portion includes a first conductivity type emitter region that is exposed on the upper surface of the semiconductor substrate and in contact with the gate trench portion,
the semiconductor device comprises:
an emitter electrode disposed above the upper surface of the semiconductor substrate and connected to the emitter region; and
an interlayer dielectric film disposed between the semiconductor substrate and the emitter electrode, and a contact hole that connects the emitter electrode to the semiconductor substrate is disposed in the interlayer dielectric film between the gate trench portion which is the closest to either of the two pads in the inter-pad region and the pad.

16. The semiconductor device according to claim 15, wherein
a dummy trench portion connected to the emitter electrode is disposed between the gate trench portion which is the closest to either of the two pads in the inter-pad region and the pad.

17. The semiconductor device according to claim 10, wherein
each of the plurality of pads is disposed in such a position that the pad at least partially faces the diode portion in the extension direction.

18. The semiconductor device according to claim 10, wherein
the transistor portion further includes an other gate trench portion disposed extending in the extension direction and adjacent to the gate trench portion,
a base region is provided between the gate trench portion and the other gate trench portion, and
a well region is provided in the at least one of inter-pad regions, the well region being provided at a deeper position in the semiconductor substrate and having higher doping concentration than the base region.

* * * * *